(12) United States Patent
Inagawa

(10) Patent No.: US 8,299,495 B2
(45) Date of Patent: Oct. 30, 2012

(54) REVERSE CONDUCTING IGBT

(75) Inventor: Hiroshi Inagawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 91 days.

(21) Appl. No.: 13/014,599

(22) Filed: Jan. 26, 2011

(65) Prior Publication Data

US 2011/0180902 A1 Jul. 28, 2011

(30) Foreign Application Priority Data

Jan. 27, 2010 (JP) .................... 2010-014996

(51) Int. Cl.
*H01L 29/66* (2006.01)
(52) U.S. Cl. ........................................ 257/139
(58) Field of Classification Search .......... 257/139, 257/328
See application file for complete search history.

(56) References Cited

U.S. PATENT DOCUMENTS

| 2008/0135871 A1* | 6/2008 | Ruething et al. ............. 257/139 |
| 2008/0315248 A1 | 12/2008 | Tokura et al. | |
| 2009/0068815 A1 | 3/2009 | Tokuda et al. | |

FOREIGN PATENT DOCUMENTS

| JP | 2007-288158 A | 11/2007 |
| WO | WO2004/109808 T | 12/2004 |

OTHER PUBLICATIONS

Takahashi, et al., "1200V Reverse Conducting IGBT", Proceedings of 2004 Symposium on Power Semiconductor Devices & IC's, pp. 133-136.

* cited by examiner

*Primary Examiner* — Bradley K Smith
(74) *Attorney, Agent, or Firm* — Miles & Stockbridge P.C.

(57) ABSTRACT

In a reverse conducting IGBT, diode cathode regions are formed dispersedly on the back side of a device chip. When the distribution density of the diode cathode region becomes low, VF of a fly-back diode, that is, a forward voltage drop becomes large. On the other hand, when the distribution density of the diode cathode region becomes high, it becomes hard for a PN junction at a collector part to turn ON and a snap back occurs. In contrast to this, there is a method of providing about one to several diode cathode absent regions having a macro area, however, the arrangement of the regions itself directly affects the device characteristics, and therefore, it is difficult to control the device characteristics and variations thereof.

In the present invention, dot-shaped diode cathode regions on the back side of the device chip are distributed into the shape of a substantially uniform XY lattice and at the same time, the lattice constant in a Y direction is made longer than that in an X direction in parallel with a linear gate electrode in a reverse conducting IGBT having a large number of the linear gate electrodes.

20 Claims, 25 Drawing Sheets

REVERSE CONDUCTING IGBT

CROSS-REFERENCE TO RELATED APPLICATION

The disclosure of Japanese Patent Application No. 2010-14996 filed on Jan. 27, 2010 including the specification, drawings and abstract is incorporated herein by reference in its entirety.

BACKGROUND OF THE INVENTION

The present invention relates to technology effective when applied to device structure technology of a reverse conducting IGBT (Insulated Gate Bipolar Transistor).

International Publication No. 2004-109808 Pamphlet (Patent Document 1) or United States Patent Publication No. 2009-68815 (Patent Document 2) corresponding thereto discloses a reverse conducting IGBT that incorporates a fly-back diode by forming a plurality of stripe-shaped N-type impurity regions via an embedded insulating film between the N-type impurity regions and a P-type collector region on the back side of the device.

Japanese Patent Laid-Open No. 2007-288158 (Patent Document 3) or United States Patent Publication No. 2008-315248 (Patent Document 4) corresponding thereto discloses a reverse conducting IGBT that incorporates an FBD by forming a plurality of stripe-shaped N-type impurity regions in a P-type collector region on the back side of the device.

United States Patent Publication No. 2008-135871 (Patent Document 5) discloses a reverse conducting IGBT which incorporates an FBD by forming dot-shaped N-type impurity regions in the shape of a lattice in a P-type collector region on the back side of the device and which partially provides a part where the dot-shaped N-type impurity region dos not exist.

"1200V Reverse Conducting IGBT", by Takahashi and three others, Proceedings of 2004 International Symposium on Power Semiconductor Devices & IC's, Kita-Kyushu (Japan), pp. 133-136 (Non-Patent Document 1) discloses technology of a reverse conducting IGBT that incorporates an FBD by forming a plurality of stripe-shaped N-type impurity regions in a P-type collector region on the back side of the device using thin film wafer processing technology.

SUMMARY OF THE INVENTION

In the reverse conducting IGBT, that is, the IGBT with a fly-back diode incorporated, a large number of dot-shaped diode cathode regions are formed dispersedly on the back side of a device chip. When the distribution density of the diode cathode region becomes low, VF of the fly-back diode, that is, the forward voltage drop becomes large. On the other hand, when the distribution density of the diode cathode region becomes high, it becomes hard for a PN junction at a collector part to turn ON and a snap back occurs. In contrast to this, there is a method of providing about one to several diode cathode absent regions having a macro area. However, the arrangement itself of this kind of macro pattern directly affects the device characteristics, and therefore, it is difficult to control the device characteristics and variations thereof.

The present invention has been made to resolve these problems.

The present invention has been made in view of the above circumstances and provides a reverse conducting IGBT having excellent characteristics.

The other purposes and the new feature of the present invention will become clear from the description of the present specification and the accompanying drawings.

The following explains briefly the outline of a typical invention among the inventions disclosed in the present application.

That is, according to one aspect of the inventions of the present application, in a reverse conducting IGBT having a large number of linear gate electrodes, dot-shaped diode cathode regions on the back side of a device chip are distributed in the shape of substantially a uniform XY lattice and the lattice constant in a Y direction is made longer than that in an X direction in parallel with the linear gate electrodes.

The following explains briefly the effect acquired by the typical invention among the inventions disclosed in the present application.

That is, in the reverse conducting IGBT having a large number of linear gate electrodes, it is possible to obtain excellent fly-back diode characteristics while avoiding the occurrence of a snap back by distributing dot-shaped diode cathode regions on the back side of the device chip in the shape of substantially a uniform XY lattice and at the same time, making the lattice constant in the Y direction longer than that in the X direction in parallel with the linear gate electrodes.

DETAILED DESCRIPTION OF PREFERRED EMBODIMENTS

Outline of Embodiment

Figure 1:
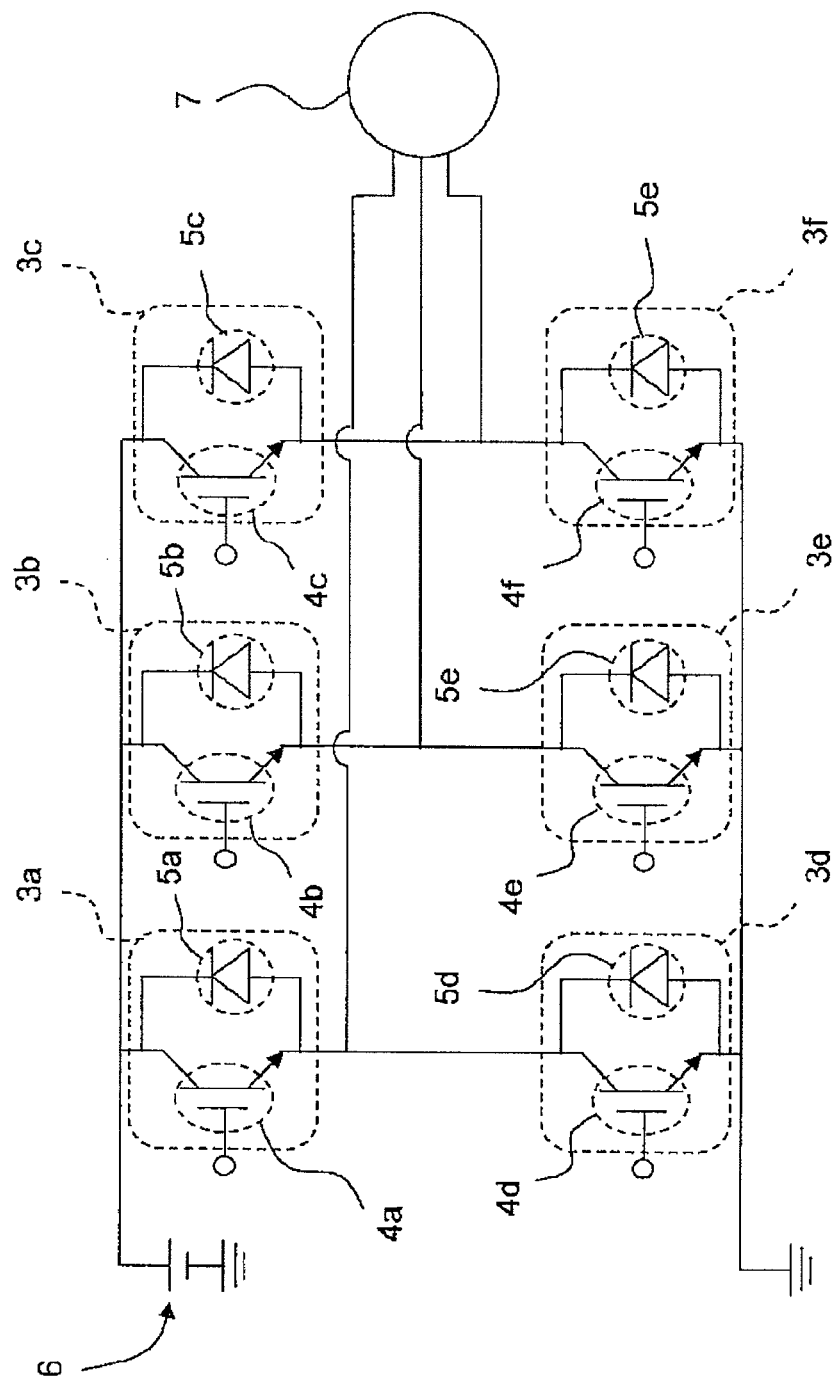
FIG. 1 is a circuit diagram of relevant parts showing an example of a circuit when a reverse conducting IGBT in an embodiment of the present invention is applied to a motor drive circuit.

First, an outline of a typical embodiment of the invention disclosed in the present application is explained.

1. A reverse conducting IGBT comprises: (a) a rectangular semiconductor substrate having a first and a second main surfaces; (b) a drift region of a first conductivity type occupying essential parts of the semiconductor substrate; (c) an IGBT cell region provided in a surface region of the first main surface of the semiconductor substrate and having a large number of linear gate electrodes extending in an X direction; (d) a collector region of a second conductivity type provided across substantially the entire surface in a surface region of the second main surface of the semiconductor substrate; (e) a large number of dot-shaped diode cathode regions of a first conductivity type provided in a surface region of the second main surface of the semiconductor substrate so as to penetrate through the collector region; and (f) a back side metal electrode layer provided over the second main surface so as to short-circuit the collector region and the large number of dot-shaped diode cathode regions, wherein the large number of dot-shaped diode cathode regions constitute an XY two-dimensional lattice in the second main surface; the lattice constant in the X direction differs from that in a Y direction; and the lattice constant in the Y direction is longer than that in the X direction.

2. In the reverse conducting IGBT in item 1, the XY two-dimensional lattice is an orthogonal lattice.

3. In the reverse conducting IGBT in item 1 or 2, each linear gate electrode of the large number of linear gate electrodes extends along the X direction.

4. In the reverse conducting IGBT in any one of items 1 to 3, the large number of dot-shaped diode cathode regions are spread uniformly across the entire surface of the second main surface.

5. In the reverse conducting IGBT in any one of items 1 to 4, the length of a side in the Y direction of the semiconductor substrate is substantially an integer multiple of the lattice constant in the Y direction.

6. In the reverse conducting IGBT in any one of items 1 to 5, the length of a side in the X direction of the semiconductor substrate is substantially an integer multiple of the lattice constant in the X direction.

7. In the reverse conducting IGBT in any one of items 1 to 6, the whole drift region is a semiconductor region of a first conductivity type.

8. The reverse conducting IGBT in any one of items 1 to 7, further comprises (g) a field stop region provided between the drift region and the collector region and having a first conductivity type with concentration higher than that of the drift region.

9. In the reverse conducting IGBT in any one of items 1 to 8, the first conductivity type is an N type and the second conductivity type is a P type.

10. In the reverse conducting IGBT in any one of items 1 to 9, the large number of dot-shaped diode cathode regions constitute the XY two-dimensional lattice in substantially the entire surface of the second main surface.

11. A reverse conducting IGBT comprises; (a) a rectangular semiconductor substrate having a first and a second main surfaces; (b) a drift region having a first conductivity-type region occupying essential parts of the semiconductor substrate; (c) an IGBT cell region provided in a surface region of the first main surface of the semiconductor substrate and having a large number of linear gate electrodes extending in an X direction; (d) a collector region of a second conductivity type provided across substantially the entire surface in a surface region of the second main surface of the semiconductor substrate; (e) a large number of dot-shaped diode cathode regions of a first conductivity type provided in a surface region of the second main surface of the semiconductor substrate so as to penetrate through the collector region; and (f) a back side metal electrode layer provided over the second main surface so as to short-circuit the collector region and the large number of dot-shaped diode cathode regions, wherein the large number of dot-shaped diode cathode regions constitute an XY two-dimensional lattice in the second main surface, the lattice constant in the X direction differs from that in a Y direction, and the lattice constant in the Y direction is longer than that in the X direction.

12. In the reverse conducting IGBT in item 11, the XY two-dimensional lattice is an orthogonal lattice.

13. In the reverse conducting IGBT in item 11 or 12, each linear gate electrode of the large number of linear gate electrodes extends along the X direction.

14. In the reverse conducting IGBT in any one of items 11 to 13, the large number of dot-shaped diode cathode regions are spread uniformly across the entire surface of the second main surface.

15. In the reverse conducting IGBT in any one of items 11 to 14, the length of a side in the Y direction of the semiconductor substrate is substantially an integer multiple of the lattice constant in the Y direction.

16. In the reverse conducting IGBT in any one of items 11 to 15, the length of a side in the X direction of the semiconductor substrate is substantially an integer multiple of the lattice constant in the X direction.

17. The reverse conducting IGBT in any one of items 11 to 16, further comprises (g) a field stop region provided between the drift region and the collector region and having a first conductivity type with concentration higher than that of the drift region.

18. In the reverse conducting IGBT in any one of items 11 to 17, the first conductivity type is an N type and the second conductivity type is a P type.

19. In the reverse conducting IGBT in any one of items 11 to 18, the large number of dot-shaped diode cathode regions constitute the XY two-dimensional lattice in substantially the entire surface of the second main surface.

20. In the reverse conducting IGBT in any one of items 1 to 19, the large number of dot-shaped diode cathode regions occupy almost all lattice points of the XY two-dimensional lattice in the second main surface.

[Explanation of Description Form, Basic Terms, Usage in the Present Application]

1. In the present application, the embodiments will be explained, divided into plural sections for convenience, if necessary for convenience, however, except for the case where it shows otherwise clearly in particular, they are not mutually independent individually and in each part of a single example, one has relationships such as details and modification of some or entire of another. As a general rule, the similar parts are not repeated. Each element in the embodiments is not necessarily indispensable, except for the case where it is clearly specified otherwise in particular, where it is considered to be clearly restricted to a specific number theoretically, and where it is clear from context.

Further, when "semiconductor device" is referred to in the present application, it means a single body of various kinds of transistor (active elements) or one in which resistors, capacitors, etc., are integrated over a semiconductor chip etc. (for example, a single crystal silicon substrate) with a transistor as a center. Here, as a typical one of the various kinds of transistor, mention is made of MISFET (Metal Insulator Semiconductor Field Effect Transistor) represented by MOSFET (Metal Oxide Semiconductor Field Effect Transistor). As a typical one of the various kinds of single transistor, mention is made of a power MOSFET and IGBT (Insulated Gate Bipolar Transistor). These are generally classified as a power semiconductor device, including a bipolar power transistor, thyristor, power diode, etc., in addition to a power MOSFET, IGBT.

A typical aspect of a power MOSFET is a double diffused vertical power MOSFET in which a source electrode is located on the surface and a drain electrode is located on the back side, however, the double diffused vertical power MOSFET can be generally classified into two kinds and the first kind is a planar gate type to be explained mainly in a first embodiment and the second kind is a trench gate type, such as a U-MOSFET.

The power MOSFET further includes an LD-MOSFET (Lateral-diffused MOSFET).

2. Similarly, in the description of the embodiment etc., the wording "X including A" as to a material, composition, etc., does not exclude one which has an element other than A as its main element except for the case where it is shown otherwise clearly in particular or the case where it is clearly not from context. For example, it means "X including A as its main element" as to component. For example, "silicon member" etc. is not limited to pure silicon and it is needless to say that a SiGe alloy, a multi-element alloy, additive, etc., having silicon as its main element are also included. Similarly, it is needless to say that "silicon oxide film", "silicon oxide based insulating film", etc., also include, in addition to a comparatively pure undoped silicon oxide, FSG (Fluorosilicate Glass), TEOS-based silicon oxide, SiOC (Silicon Oxicarbide) or Carbon-doped silicon oxide or OSG (Organosilicate glass), a thermally oxidized film, such as PSG (Phosphorus Silicate Glass) and BPSG (Borophosphosilicate Glass), a CVD oxide film, SOG (Spin On Glass), silicon oxide for application, such as Nano-Clustering Silica (NCS), a silica-based Low-k insulating film (porous insulating film) in which cavities are introduced into the same members described above, a compound film with another silicon-based insulating film having these as its main element, etc.

Like a silicon oxide based insulating film, as a silicon based insulating film generally used in the field of semiconductor, there is a silicon nitride based insulating film. Materials belonging to this series include SiN, SiCN, SiNH, SiCNH, etc. Here, when referring to "silicon nitride", it includes both SiN and SiNH except for the case where it is shown otherwise clearly in particular. Similarly, when referring to "SiCN", it includes both SiCN and SiCNH except for the case where it is shown otherwise clearly in particular.

SiC has properties similar to those of SiN, however, SiON is rather classified as a silicon oxide based insulating film in many cases.

3. Similarly, appropriate examples of figures, positions, attributes, etc., are shown, however, it is needless to say that these are not limited strictly except for the case where it is shown otherwise clearly in particular and the case where it is clearly not from context.

4. Further, when referring to specific values and the number of elements, except for the case where they are shown otherwise clearly in particular, where they are clearly restricted to a specific value or number theoretically, and where they are clearly not from context, they may be greater or smaller than the specific value or number.

5. When referring to "wafer", usually, it refers to a single crystal silicon wafer over which a semiconductor device (semiconductor integrated circuit device, electronic device are the same) is formed, however, it is needless to say that it includes a compound wafer etc. of an insulating substrate, such as an epitaxial wafer, an SOI substrate, and an LCD glass substrate, and a semiconductor layer etc.

In the present application, when referring to "single crystal region" etc., it is assumed that it includes an epitaxial region except for the case where it is shown otherwise clearly in particular and where it is clearly not.

6. As to the drift region of a power MOSFET etc., in order to avoid restrictions due to the silicon limit of a conventional structure including a single conductivity type epitaxial region to obtain a highly durable FET etc. with low ON resistance, a super junction structure has been introduced, which alternately has N-type column regions and P-type column regions in the shape of a slab having a comparatively high concentration in the drift region (main current path). Methods of introducing the super junction structure roughly include three kinds of method, that is, the multi-epitaxial method, the trench insulating film embedding method, and the trench fill method (trench filling method, auto-fill method, or trench epitaxial embedding method). Among these methods, the multi-epitaxial method, in which the epitaxial growth and ion implantation are repeated a number of times, costs high because processes become complicated resulting from the high degree of freedom in process and design. The trench insulating film embedding method is a method in which after ions are implanted obliquely into a trench, the trench is filled with a CVD (Chemical Vapor Deposition) insulating film and the processes are simpler, however, the area of the trench is disadvantageous accordingly. In contrast to these, the trench fill method has a merit that processes are simple although the degree of freedom in process and design is comparatively low because of the restrictions of the growth condition of the embedded epitaxial growth.

In general, the super junction structure is a structure in which into a semiconductor region of a certain conductivity type, cylindrical or plate-shaped column regions of opposite conductivity type are inserted at equal intervals so that the charge balance is maintained.

In the embodiments of the present application, as an appropriate example of a trench gate-type IGBT device, a single conductivity-type drift region is explained, however, it is assumed that the "drift region" includes one to which the super junction structure is applied.

Details of Embodiments

Embodiments are explained in more detail. In each figure, the same or similar parts are denoted by the same or similar symbols or reference numerals and their explanation are not repeated as a general rule.

In an accompanied drawing, when it become more complicated on the contrary or when distinction between vacant space and element is clear, hatching etc. may be omitted even if it is a section. In relation to this, when clear from explanation etc., the background contour may be omitted even if it is a closed hole in a planar manner. Further, in order to show an element rather than vacant space explicitly, hatching may be attached even if it is not a section.

1. Explanation of applied circuit etc. of IGBT with a fly-back diode incorporated, which is a reverse conducting IGBT (semiconductor device) in an embodiment of the present application (mainly, FIG. 1 and FIG. 2)

Figure 2:
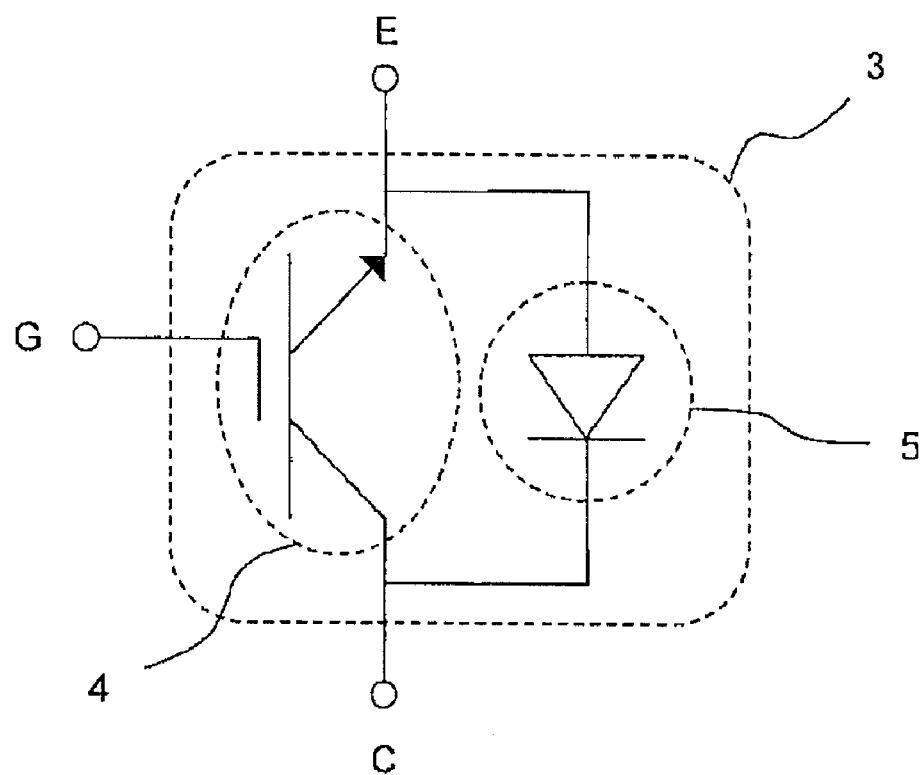
FIG. 2 is a schematic circuit diagram for explaining a basic structure of a reverse conducting IGBT in an embodiment of the present invention.

FIG. 1 is a circuit diagram of relevant parts showing an example of a circuit when a reverse conducting IGBT in an embodiment of the present invention is applied to a motor drive circuit. FIG. 2 is a schematic circuit diagram for explaining a basic structure of a reverse conducting IGBT in an embodiment of the present invention. An example of application of an IGBT with a fly-back diode incorporated is explained, which is a reverse conducting IGBT in an embodiment of the present application.

An example of a specific circuit to which IGBTs with a fly-back diode incorporated 3a, 3b, 3c, 3d, 3e and 3f are applied is shown in FIG. 1 (three-phase motor drive circuit). As shown in FIG. 1, the three-phase motor drive circuit drives a three-phase motor 7 by switching the output from a direct current power source 6 at high speed using the IGBTs with a fly-back diode incorporated 3a, 3b, 3c, 3d, 3e and 3f. Each of the IGBTs with a fly-back diode incorporated 3a, 3b, 3c, 3d, 3e and 3f is configured by combining IGBT element parts 4a, 4b, 4c, 4d, 4e and 4f and fly-back diode parts 5a, 5b, 5c, 5d, 5e and 5f.

Here, as shown in FIG. 2, each IGBT element 3 with a fly-back diode incorporated (reverse conducting IGBT) is configured by an IGBT element part 4 and a fly-back diode part 5. Each terminal of the reverse conducting IGBT element 3 is called an emitter terminal E, a collector terminal C, a gate terminal G, etc., for convenience in correspondence to the terminals of a conventional bipolar transistor (or power MOSFET), however, these names do not necessarily correspond to the operations of the internal transistor.

2. Explanation of device structure of reverse conducting IGBT (semiconductor device) in an embodiment of the present application (mainly, FIG. 3 to FIG. 5)

In this section, an example of a chip of the reverse conducting IGBT element 3 shown in FIG. 2 is explained. In the example of the reverse conducting IGBT element 3 normally having a withstand voltage of 600 V, the average chip size is 3 to 6 mm square. For the sake of convenience of explanation, here, a chip having a length of 4 mm (in the Y direction in FIG. 3) and a width of 5.2 mm (in the X direction in FIG. 3) is taken as an example and explanation is given. Here, explanation is given on the assumption that the withstand voltage of the device is, for example, about 600 V.

Figure 3:
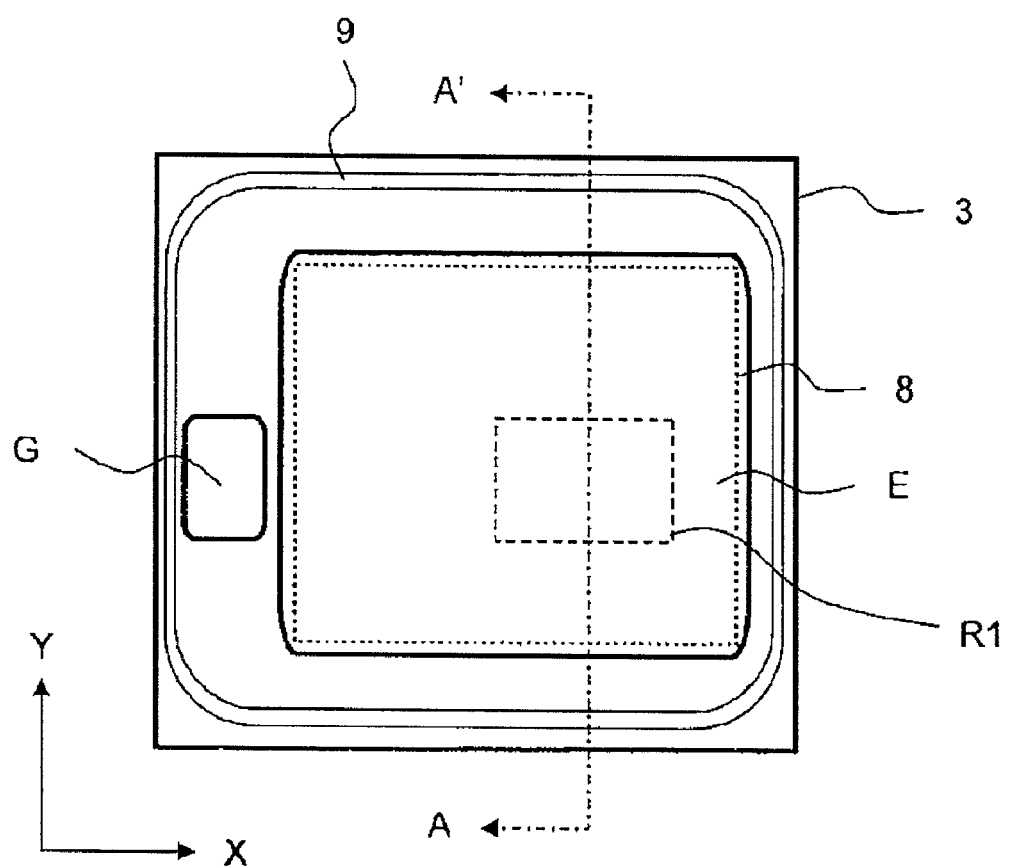
FIG. 3 is a top view of a chip of a reverse conducting IGBT in an embodiment of the present invention.
Figure 4:
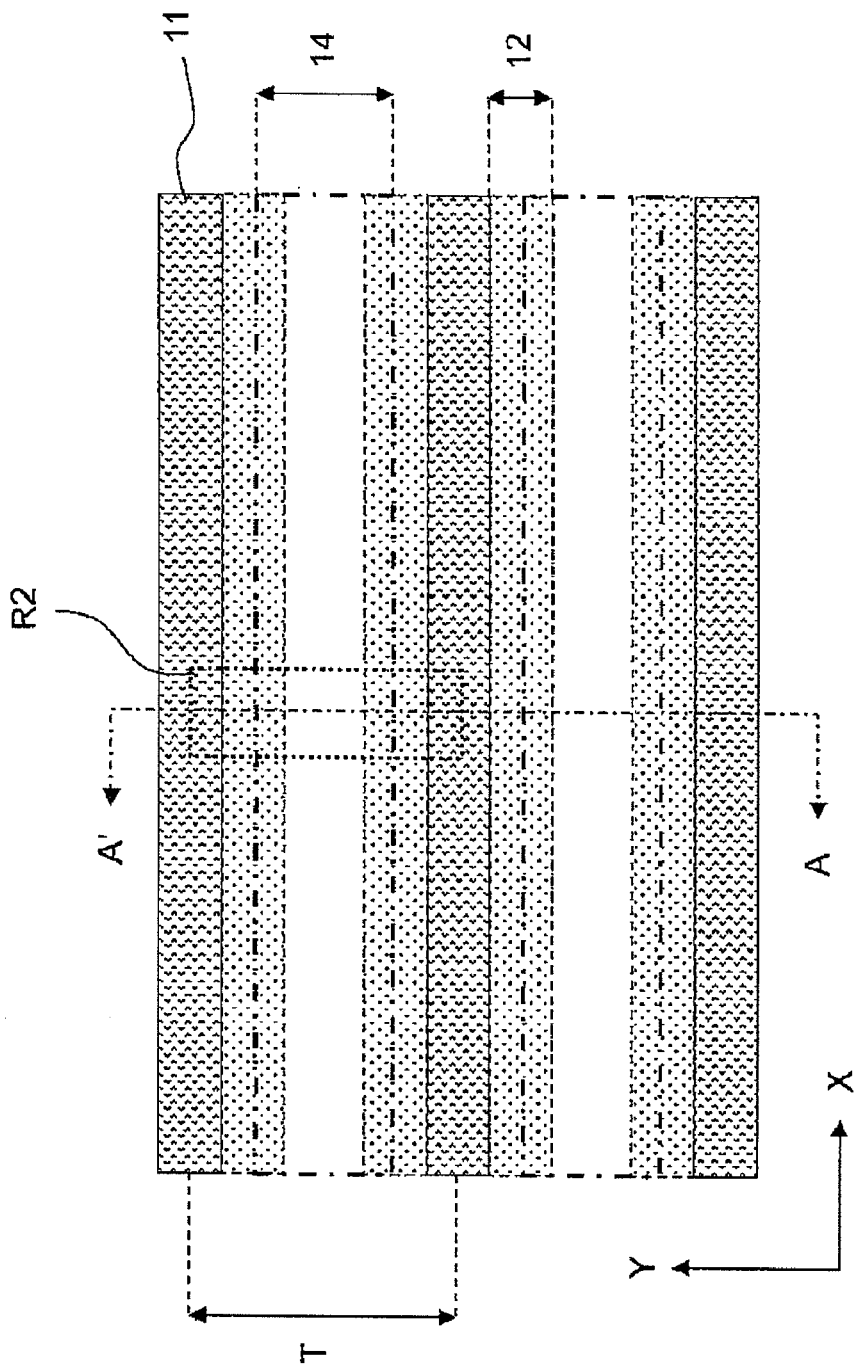
FIG. 4 is an enlarged plan view of a cell region inner wide-region cutout part R1.
Figure 5:
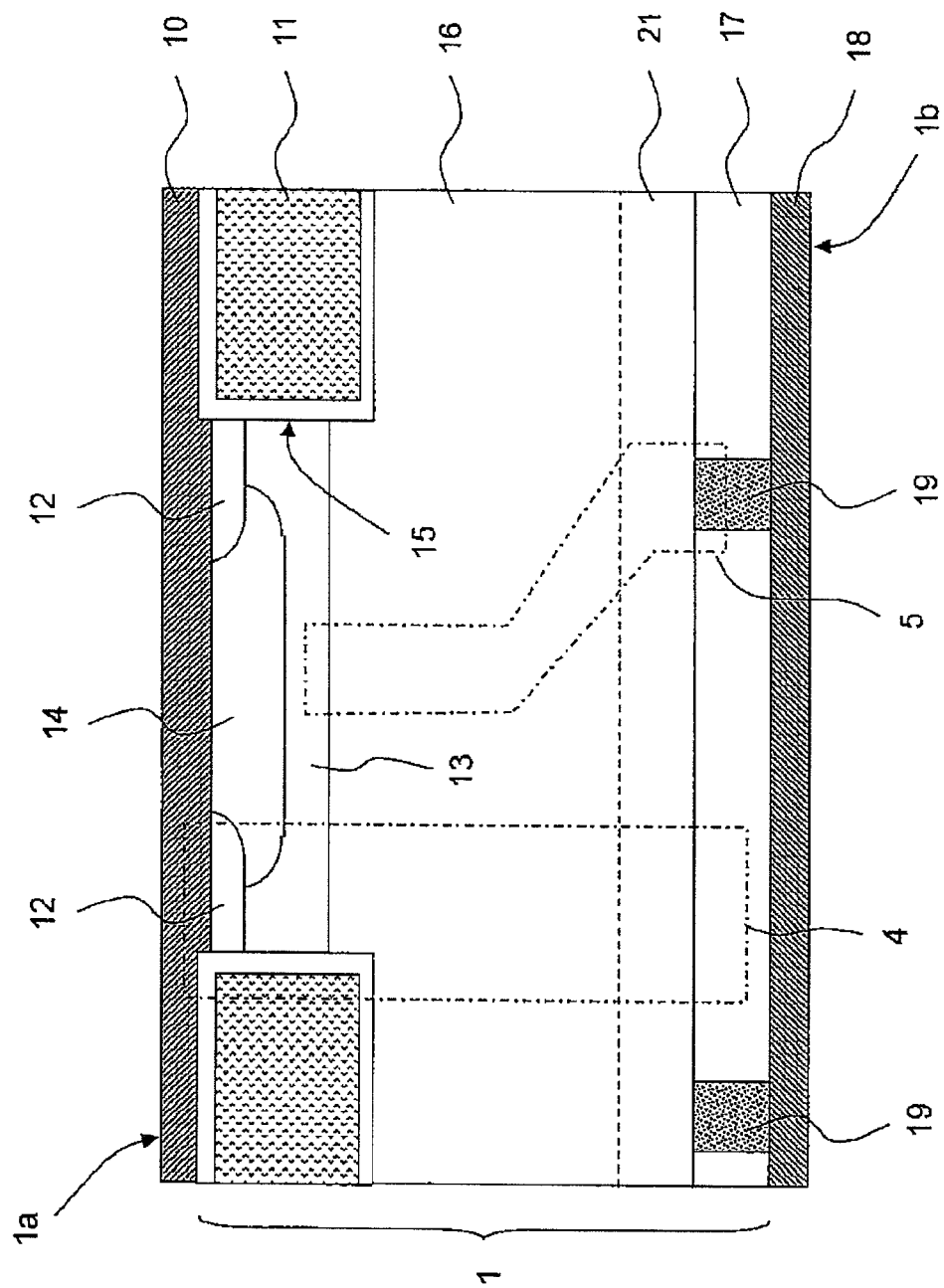
FIG. 5 is a device section view of a cell region inner unit periodic cutout part R2 in FIG. 4.

FIG. 3 is a top view of a chip of a reverse conducting IGBT in an embodiment of the present invention. FIG. 4 is an enlarged plan view of an inner wide-region cutout part R1 of a cell region 8 in FIG. 3. FIG. 5 is a device section view of an inner unit periodic cutout part R2 in the cell region 8 in FIG. 4. A device structure of a reverse conducting IGBT (semiconductor device) in an embodiment of the present application is explained. The IGBT cell region 8 has, for example, a length of about 3 mm and a width of about 4 mm in a chip having a length of 4 mm and a width of 5.2 mm.

First an outline of a structure of a top surface 1a (device surface or first main surface) of a chip is explained based on FIG. 3. As shown in FIG. 3, in the peripheral region of the chip 3 of the reverse conducting IGBT, an annular guard ring 9 is provided and a gate pad G and an emitter pad E are provided inside thereof. Here, as an example, let the length be about 4 mm and width about 5.2 mm.

Next, FIG. 4 shows an enlarged plan view of the cell region inner wide-region cutout part R1 in FIG. 3. As shown in FIG. 4, the cell region 8 (IGBT cell region) has a continuous translational symmetry (that is, a linear gate structure) in the X direction and a periodic structure of a period T (cell region repetitive structure unit period) in the Y direction. That is, in the Y direction, linear gate electrodes 11 (for example, polysilicon trench gate electrodes) having an identical width are arranged at certain intervals and an $N^+$-source region 12 is provided along each trench gate electrode 11. Further, a $P^+$-emitter region 14 is provided so as to spread over a pair of the neighboring $N^+$-source regions 12.

Next, a sectional structure of a cell region inner unit periodic cutout part R2 in FIG. 4 is shown in FIG. 5. As shown in FIG. 5, in the device surface 1a of the W-type single crystal silicon substrate 1, for example, an aluminum-based emitter metal electrode 10 is formed and in the surface region of the device surface 1a of the silicon substrate 1, the trench gate electrode 11 surrounded by insulating films (a gate insulating film 15 at the side surface part), such as the $N^+$-source region 12, a P-type well region 13, the $P^+$-emitter region 14, and a silicon oxide film. On the other hand, on the back side 1b of the silicon substrate 1, a collector metal electrode 18 is formed and in substantially the entire surface of the surface region on the side of the back side 1b of the silicon substrate 1, a $P^+$-collector region 17 (collector region of second conductivity type) is formed. The region that occupies the essential parts of the silicon substrate 1 between the P-type well region 13 and the $P^+$-collector region 17 is an $N^-$-type drift region 16 (drift region of first conductivity type) and in substantially the entire surface of the end part on the side of the $P^+$-collector region 17 of the $N^-$-type drift region 16, an N-type field stop region 21 having concentration higher than that of the $N^-$-type drift region 16 is provided. Further, a collector region penetrating N⁺-region 19 (diode cathode region) is provided so as to penetrate through the P⁺-collector region 17 and couple with the N-type field stop region 21. What is surrounded by a dash-dotted line in the figure is the IGBT element part 4 and the fly-back diode part 5. The region surrounded here is simplified for explanation and not a region that includes all the regions that function as above.

Here, an example of the dimensions of each part and impurity concentration is shown as follows. That is, the trench width is about 0.35 to 0.5 μm, the pitch of the gate electrode, about 2 to 3 μm, the trench depth, about 1.5 μm, the depth of the p-well region 13, about 1 μm (impurity concentration: boron, about $2 \times 10^{17}/cm^3$), the depth of the source region 12, about 0.25 μm (impurity concentration: arsenic, about $2 \times 10^{20}/cm^3$), the depth of the P⁺-emitter region 14, about 1.3 μm (impurity concentration: boron, about $2 \times 10^{20}/cm^3$), the thickness of the collector region 17, about 0.6 μm, and the thickness of the N-type field stop region 21, about 0.9 μm.

3. Explanation of relevant parts of manufacturing process of reverse conducting IGBT (semiconductor device) in an embodiment of the present application (mainly, FIG. 6 to FIG. 14)

Here, the wafer process is explained and a 200 f wafer of an N⁻-type silicon single crystal (for example, phosphorus concentration, about $2 \times 10^{14}/cm^3$) is explained as an example. However, the explanation given here can be applied substantially as it is to wafers of various diameters, such as 150 f, 100 f, 300 f, and 450 f. An example is shown, in which an orientation flat OF (FIG. 15) is used as a crystal orientation display part indicative of the crystal orientation, however, it may also be possible to use a notch instead of the orientation flat.

Figure 6:
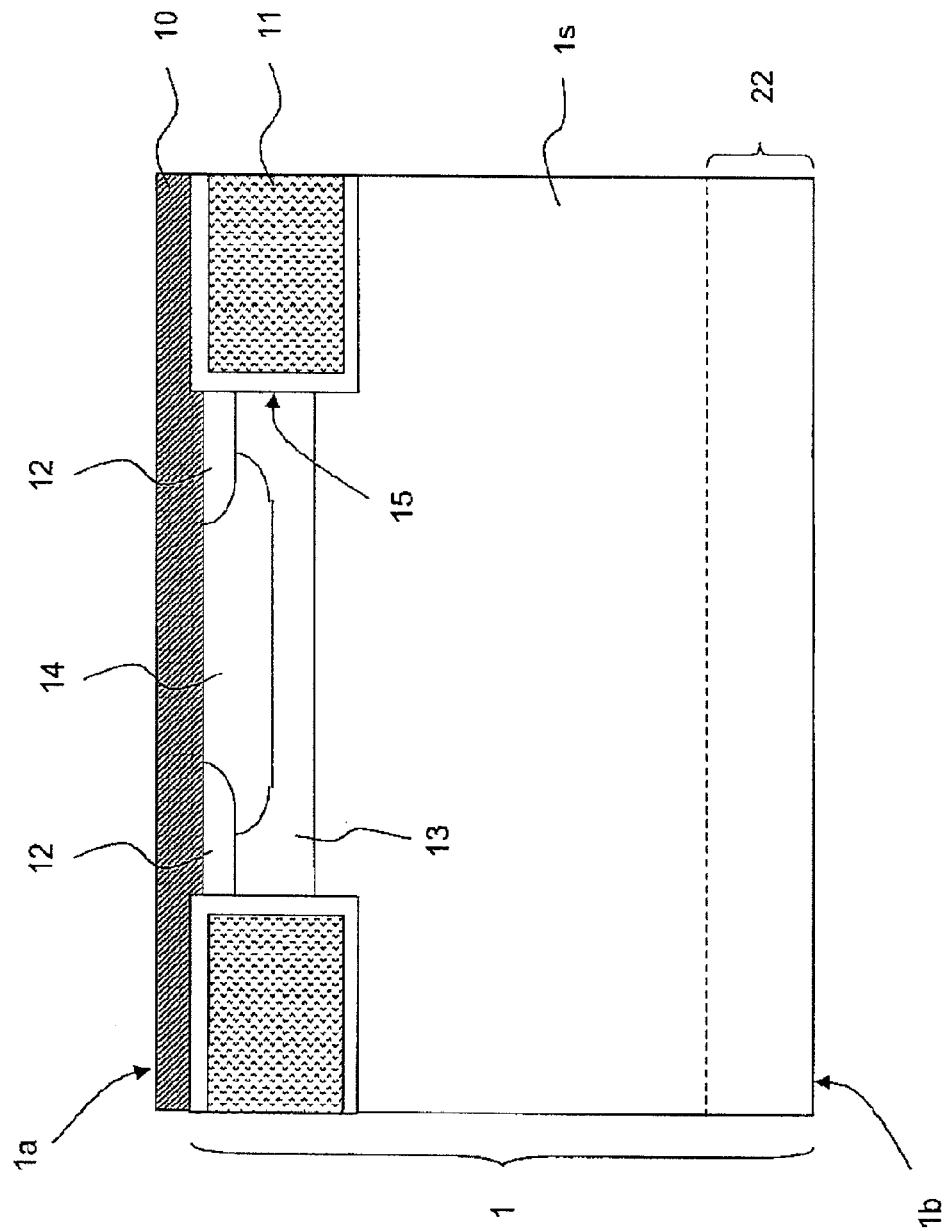
FIG. 6 is a device section process flow diagram (at the time of completion of the surface side process) corresponding to the cell region inner unit periodic cutout part R2 in FIG. 4.
Figure 7:
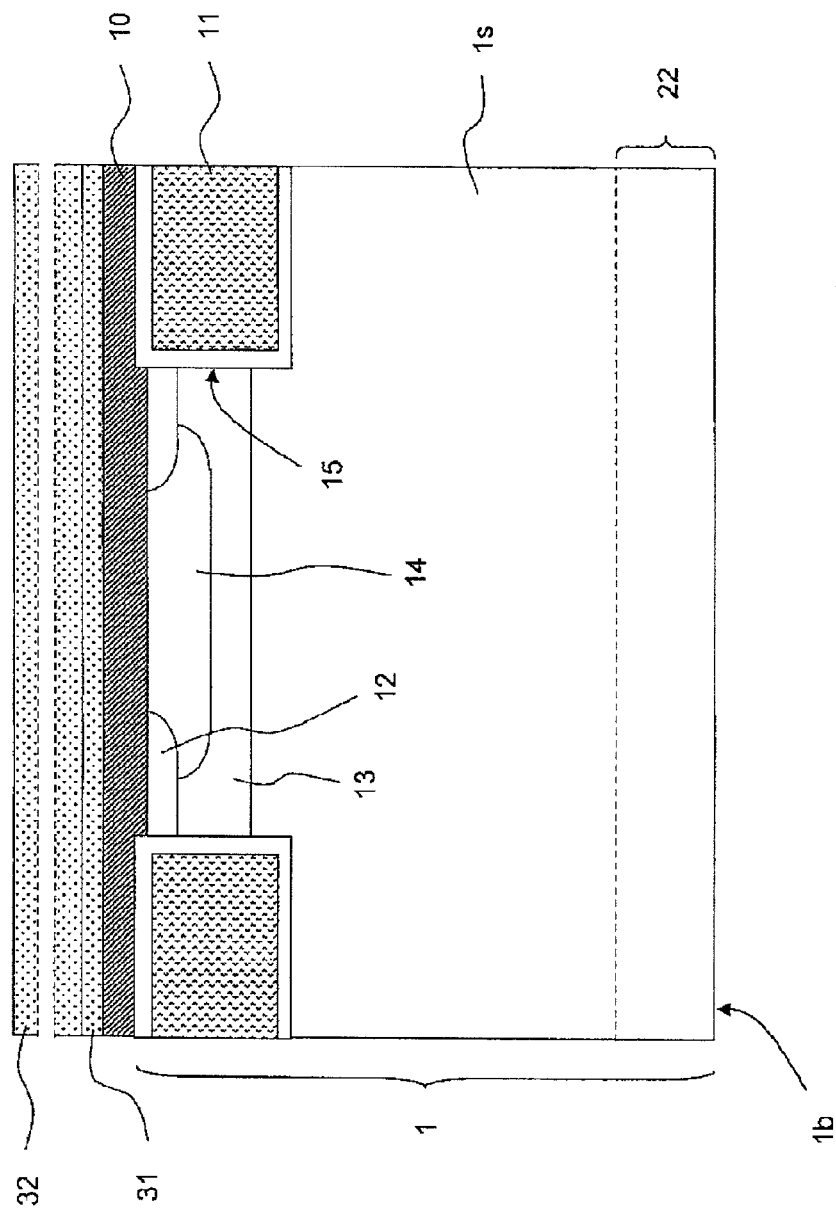
FIG. 7 is a device section process flow diagram (pasting of glass reinforcement plate) corresponding to the cell region inner unit periodic cutout part R2 in FIG. 4.
Figure 8:
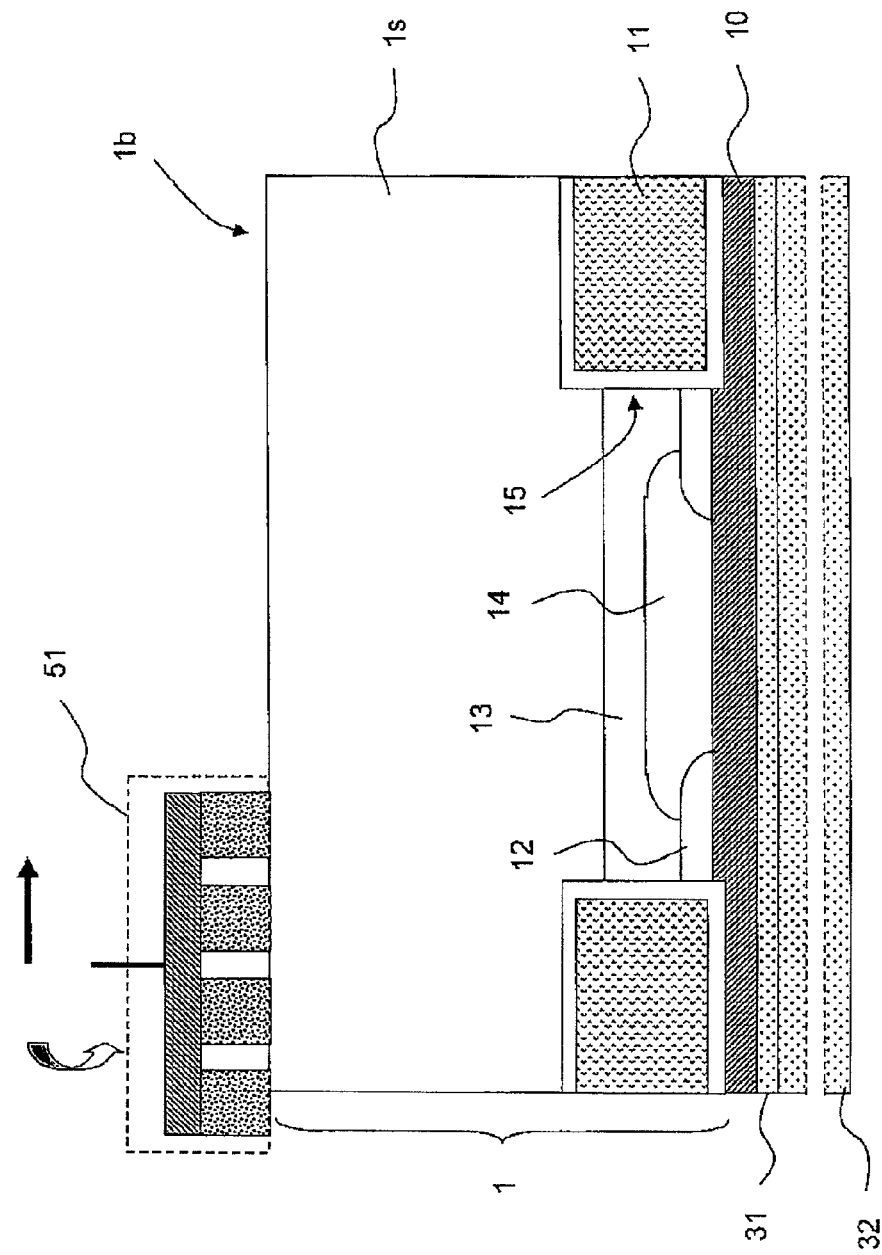
FIG. 8 is a device section process flow diagram (back grinding) corresponding to the cell region inner unit periodic cutout part R2 in FIG. 4.
Figure 9:
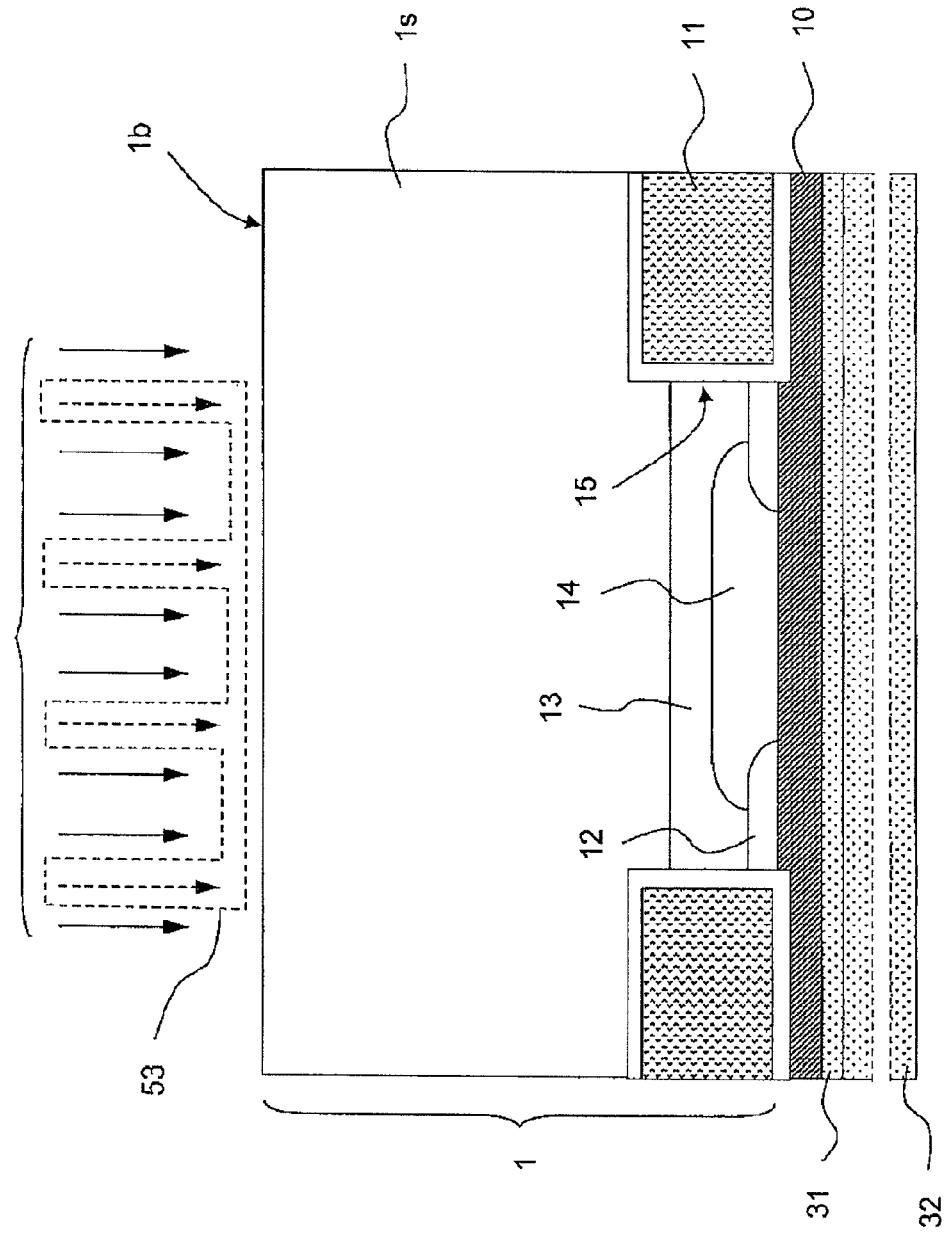
FIG. 9 is a device section process flow diagram (formation of $P^+$-collector region and N-type field stop region) corresponding to the cell region inner unit periodic cutout part R2 in FIG. 4.
Figure 10:
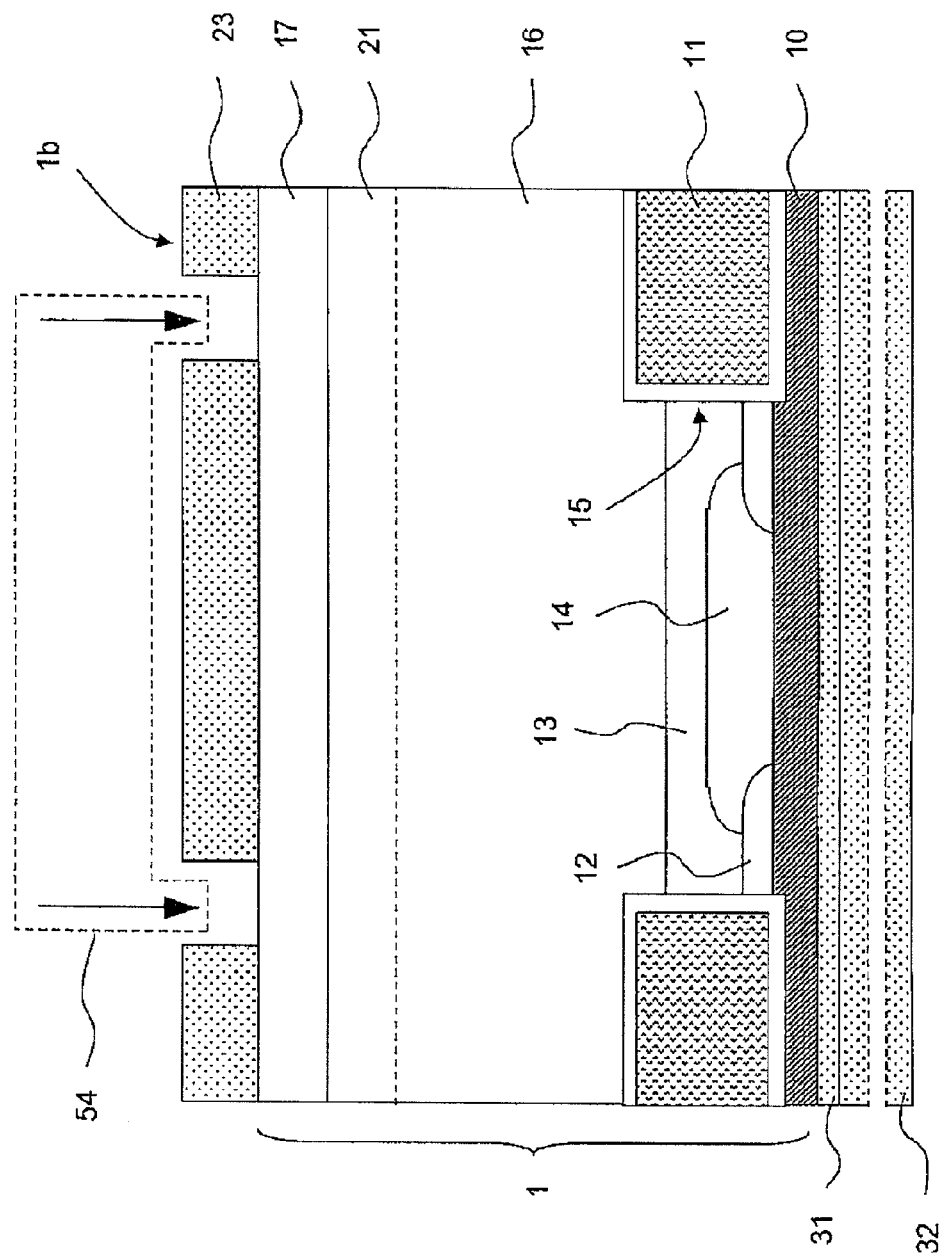
FIG. 10 is a device section process flow diagram (ion implantation into diode cathode region) corresponding to the cell region inner unit periodic cutout part R2 in FIG. 4.
Figure 11:
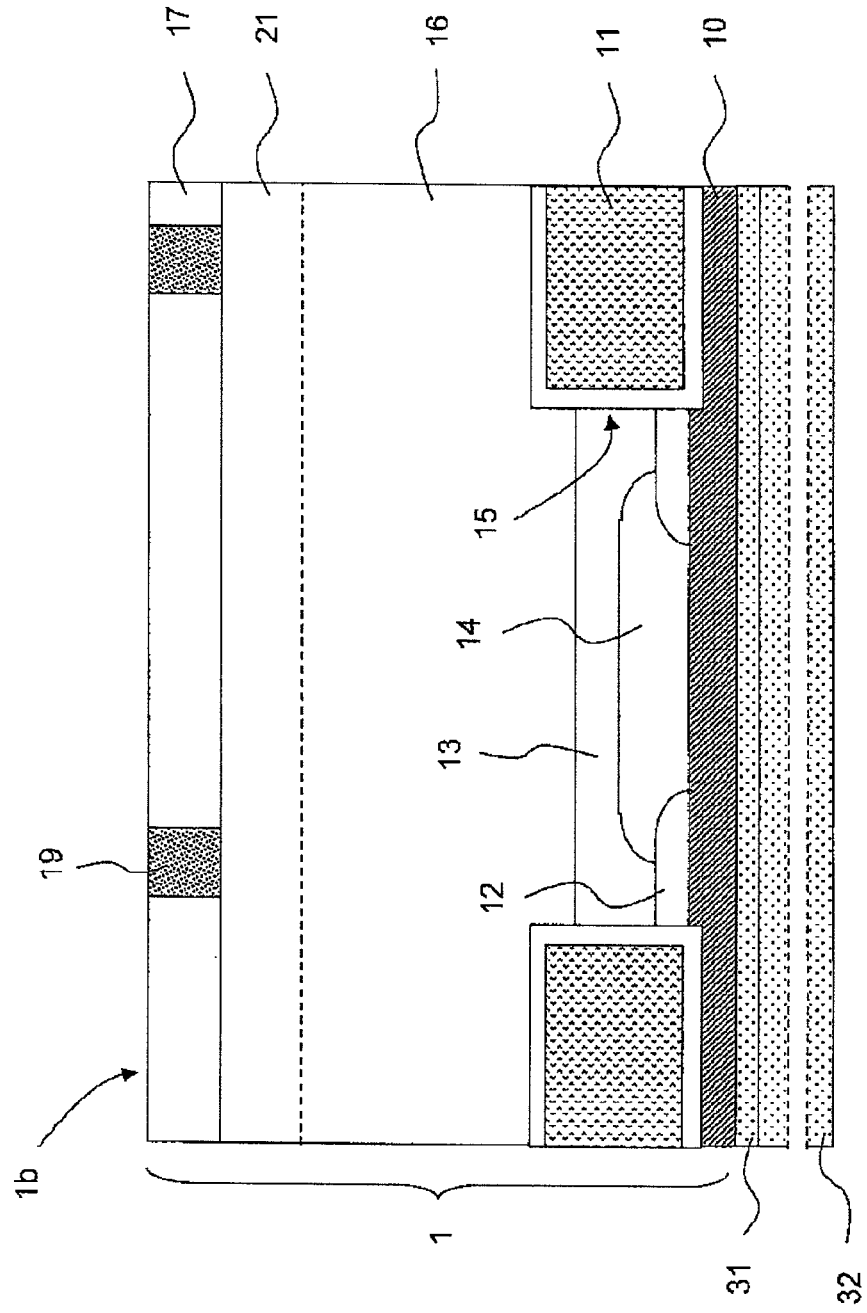
FIG. 11 is a device section process flow diagram (anneal after ion implantation) corresponding to the cell region inner unit periodic cutout part R2 in FIG. 4.
Figure 12:
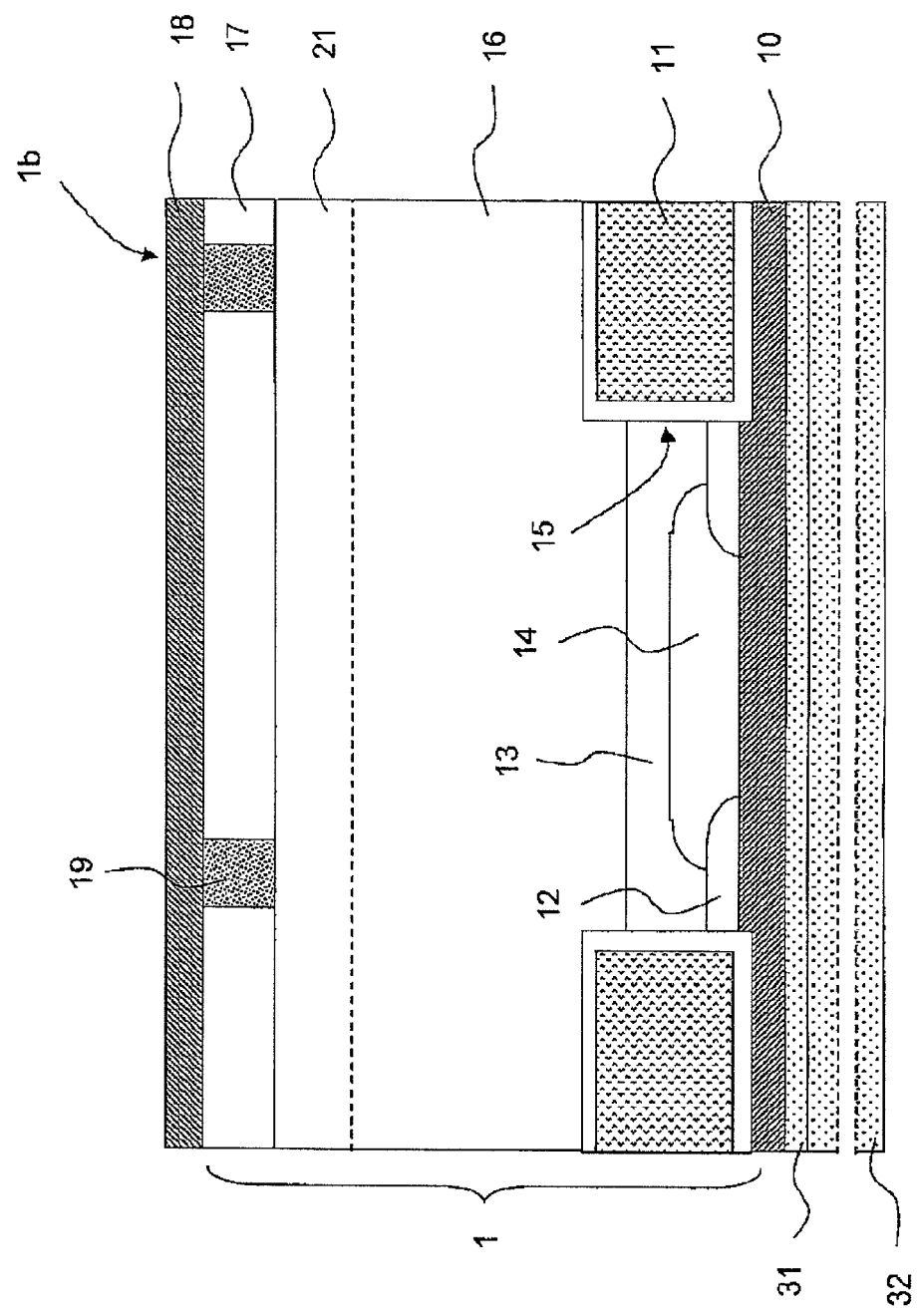
FIG. 12 is a device section process flow diagram (formation of collector metal electrode) corresponding to the cell region inner unit periodic cutout part R2 in FIG. 4.
Figure 13:
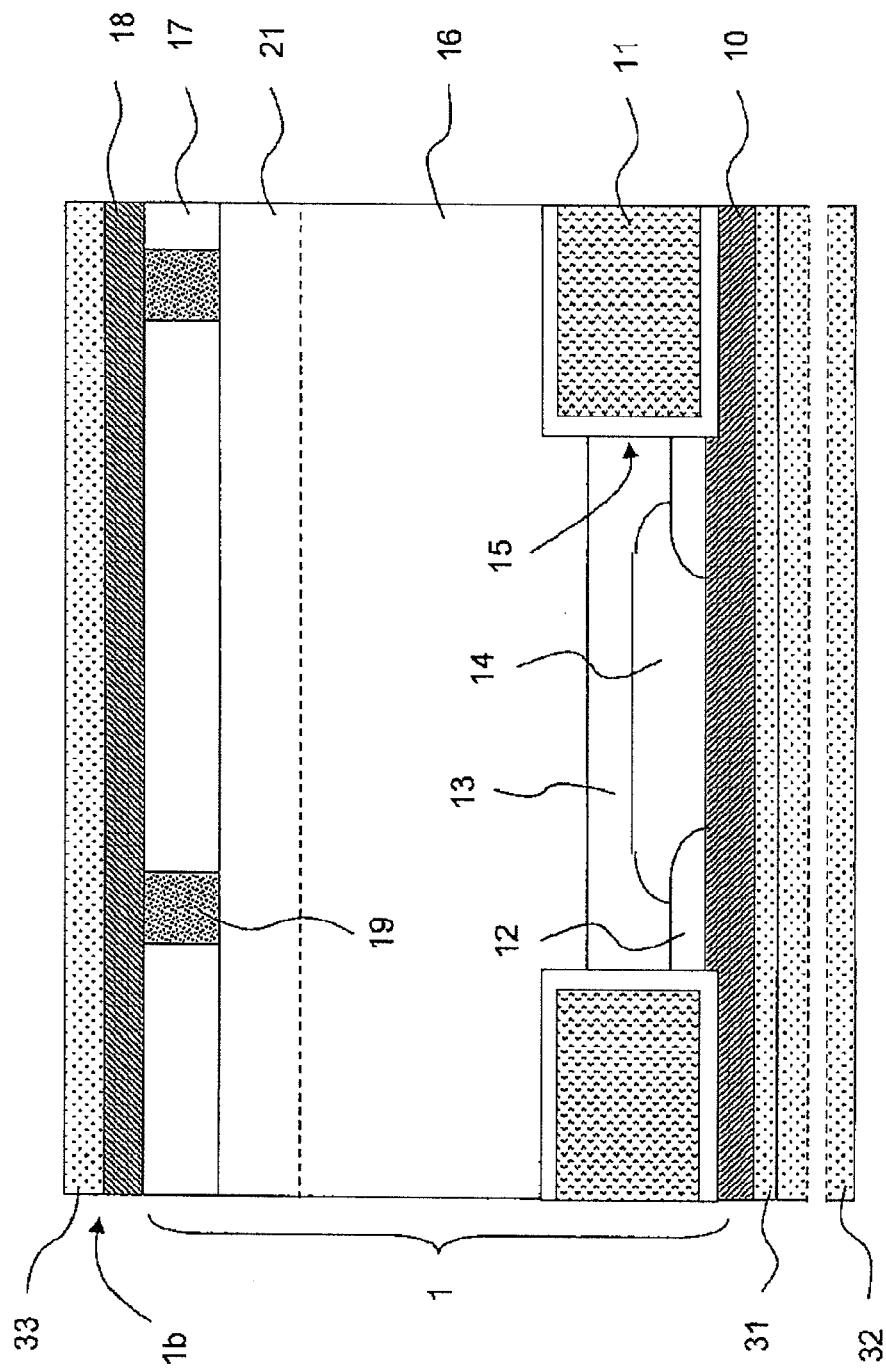
FIG. 13 is a device section process flow diagram (peeling of glass reinforcement plate) corresponding to the cell region inner unit periodic cutout part R2 in FIG. 4.
Figure 14:
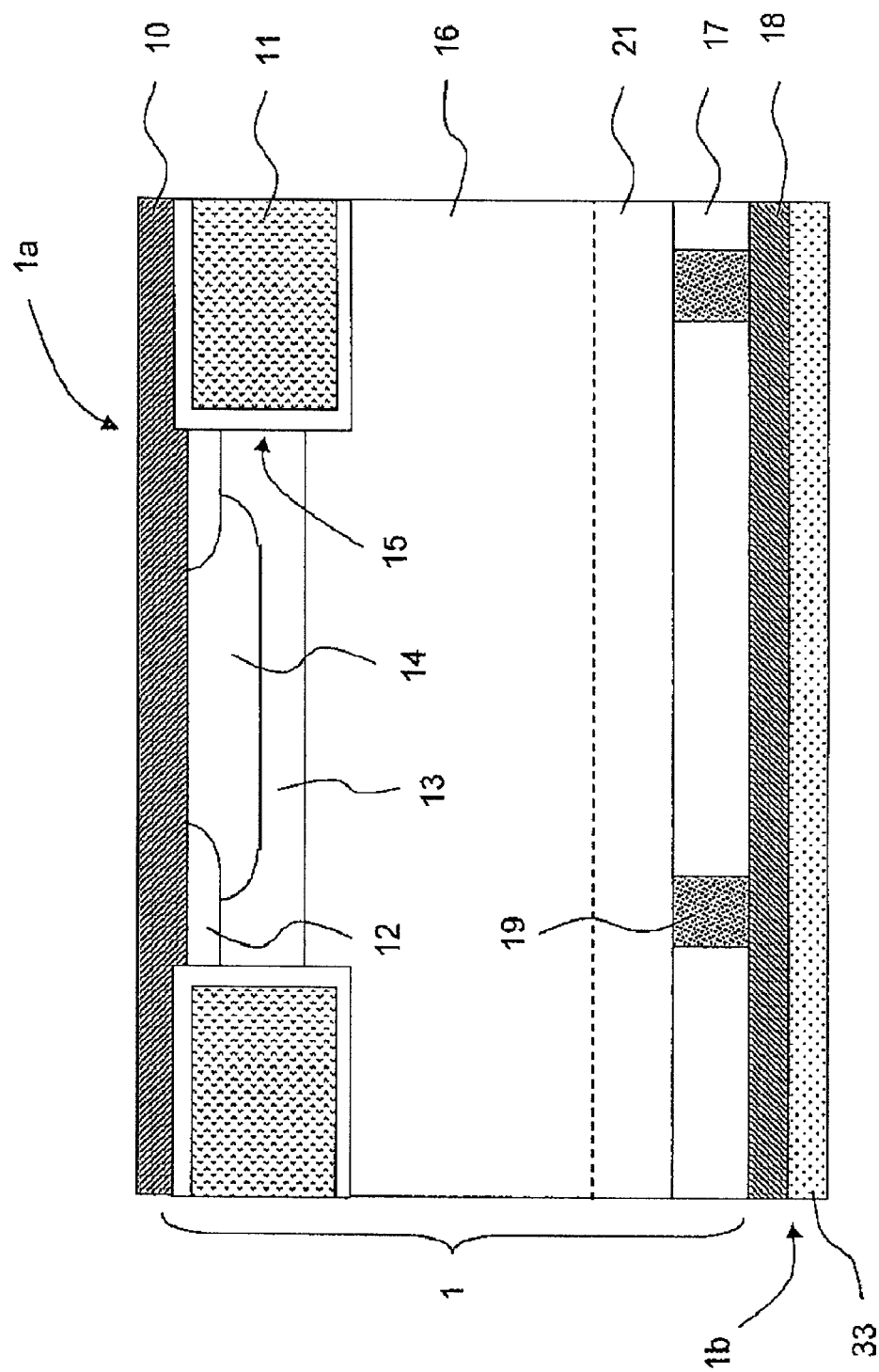
FIG. 14 is a device section process flow diagram (pasting of dicing tape & dicing) corresponding to the cell region inner unit periodic cutout part R2 in FIG. 4.

FIG. 6 is a device section process flow diagram (at the time of completion of the surface side process) corresponding to the cell region inner unit periodic cutout part R2 in FIG. 4. FIG. 7 is a device section process flow diagram (pasting of glass reinforcement plate) corresponding to the cell region inner unit periodic cutout part R2 in FIG. 4. FIG. 8 is a device section process flow diagram (back grinding) corresponding to the cell region inner unit periodic cutout part R2 in FIG. 4. FIG. 9 is a device section process flow diagram (formation of P⁺-collector region and N-type field stop region) corresponding to the cell region inner unit periodic cutout part R2 in FIG. 4. FIG. 10 is a device section process flow diagram (ion implantation into diode cathode region) corresponding to the cell region inner unit periodic cutout part R2 in FIG. 4. FIG. 11 is a device section process flow diagram (anneal after ion implantation) corresponding to the cell region inner unit periodic cutout part R2 in FIG. 4. FIG. 12 is a device section process flow diagram (formation of collector metal electrode) corresponding to the cell region inner unit periodic cutout part R2 in FIG. 4. FIG. 13 is a device section process flow diagram (peeling of glass reinforcement plate) corresponding to the cell region inner unit periodic cutout part R2 in FIG. 4. FIG. 14 is a device section process flow diagram (pasting of dicing tape & dicing) corresponding to the cell region inner unit periodic cutout part R2 in FIG. 4. Based on these, the relevant parts of the manufacturing process of the reverse conducting IGBT (semiconductor device) in an embodiment of the present application is explained.

Here, a process of the wafer process after the formation of a final passivation and the formation of an opening (gate opening, emitter opening) necessary for a final passivation film shown in FIG. 6 is explained.

When the formation of the opening necessary for the final passivation film is completed, a glass reinforcement plate (for example, about one to several millimeters in thickness) is pasted onto the surface 1a of the wafer 1 via an adhesive layer 31 as shown in FIG. 7.

Next, as shown in FIG. 8, in the state where the side of the glass reinforcement plate 32 is adsorbed to an adsorption stage of a back grinding device, a rotating grinding wheel is pressed against the back side 1b of the wafer 1 (that is, an N⁻-type substrate part 1s) and back grinding processing is performed for a part 22 to be removed by the back grinding in FIG. 7 and thereby the part is removed. At this time, the thickness of the original wafer 1 is, for example, about 725 μm, however, after the back grinding, it is about 50 to 150 μm.

Next, as shown in FIG. 9, in the state where the side of the glass reinforcement plate 32 is adsorbed to the wafer stage of the ion implanting device, boron ion implantation 52 (for example, boron, about 40 Kev, $5 \times 10^{14}/cm^2$) to form the collector region 17 (FIG. 10) and phosphorus ion implantation 53 (for example, phosphorus, about 350 Kev, $4 \times 10^{12}/cm^2$) to form a field stop region 21 (FIG. 10) are performed for substantially the entire surface of the back side 1b of the wafer 1 (N⁻-type substrate part 1s).

Next, as shown in FIG. 10, in the state where the side of the glass reinforcement plate 32 is adsorbed to the wafer stage of a spin applying device, a photoresist film (resist film 23 for implanting phosphorus ions into the collector region penetrating N⁺ region) is applied to substantially the entire surface of the back side 1b of the wafer 1 and it is patterned by normal photolithography etc. (details will be explained in section 4). Subsequently, in the state where the side of the glass reinforcement plate 32 is adsorbed to the wafer stage of the ion implanting device, phosphorus ion implantation 54 (for example, phosphorus, about 250 Kev, $5 \times 10^{14}/cm^2$ and 125 Kev, $1 \times 10^{15}/cm^2$) into the collector region penetrating N⁺ region is performed using the photoresist film 23 as a mask and thus the diode cathode region 19 is formed as shown in FIG. 11.

Next, as shown in FIG. 12, for example, in the state where the wafer 1 is installed with the side of the glass reinforcement plate 32 facing downward, over the wafer stage of the sputtering device, the collector metal electrode 18 is formed by sputtering film formation etc.

Next, as shown in FIG. 13, a dicing tape 33 is pasted to the back side 1b of the wafer 1 and the wafer 1 is fixed on the dicing frame via the dicing tape 33. After that, by removing the glass reinforcement plate 32 and the adhesive layer 31 that are no longer necessary, dicing is performed in the state as shown in FIG. 14. Due to this, such a chip as shown in FIG. 3 can be obtained.

4. Explanation of principles of reverse conducting IGBT (semiconductor device), layout of basic diode cathode region, modified examples, etc., in an embodiment of the present application (mainly FIG. 15 to FIG. 26)

In this section, a specific forming method of the collector region penetrating N⁺ region 19 (diode cathode region) explained in FIG. 5, FIG. 10, and FIG. 11, the layout (basic example and modified example), a relationship between device surface and back side, etc., are explained.

Figure 15:
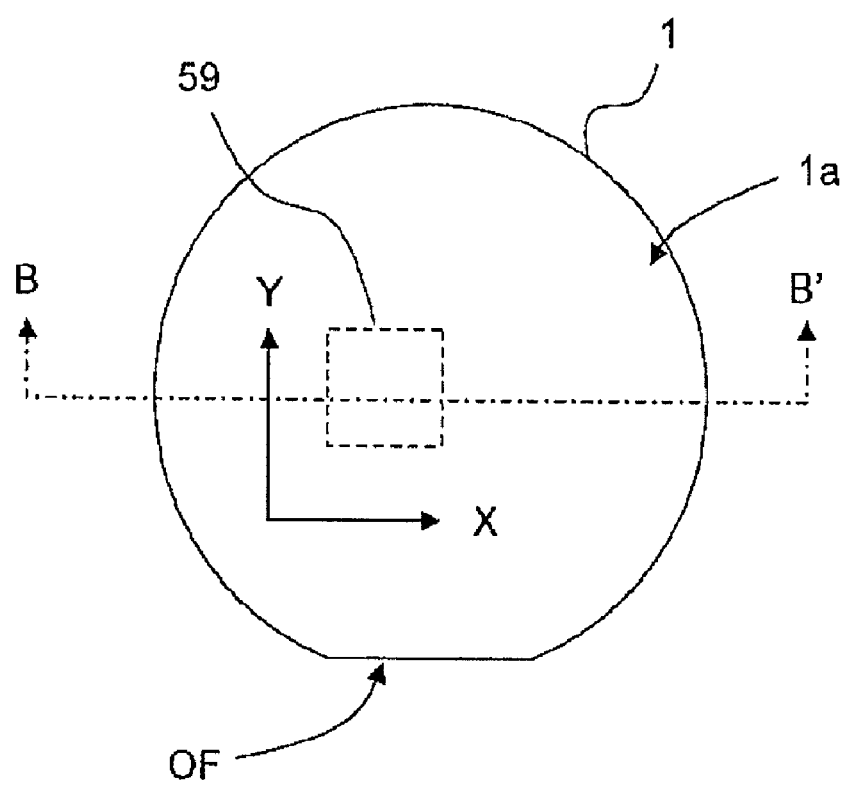
FIG. 15 is an entire diagram of a wafer top surface showing a relationship between unit shot region and chip region when patterning a device surface (that is, at the time of exposure)
Figure 16:
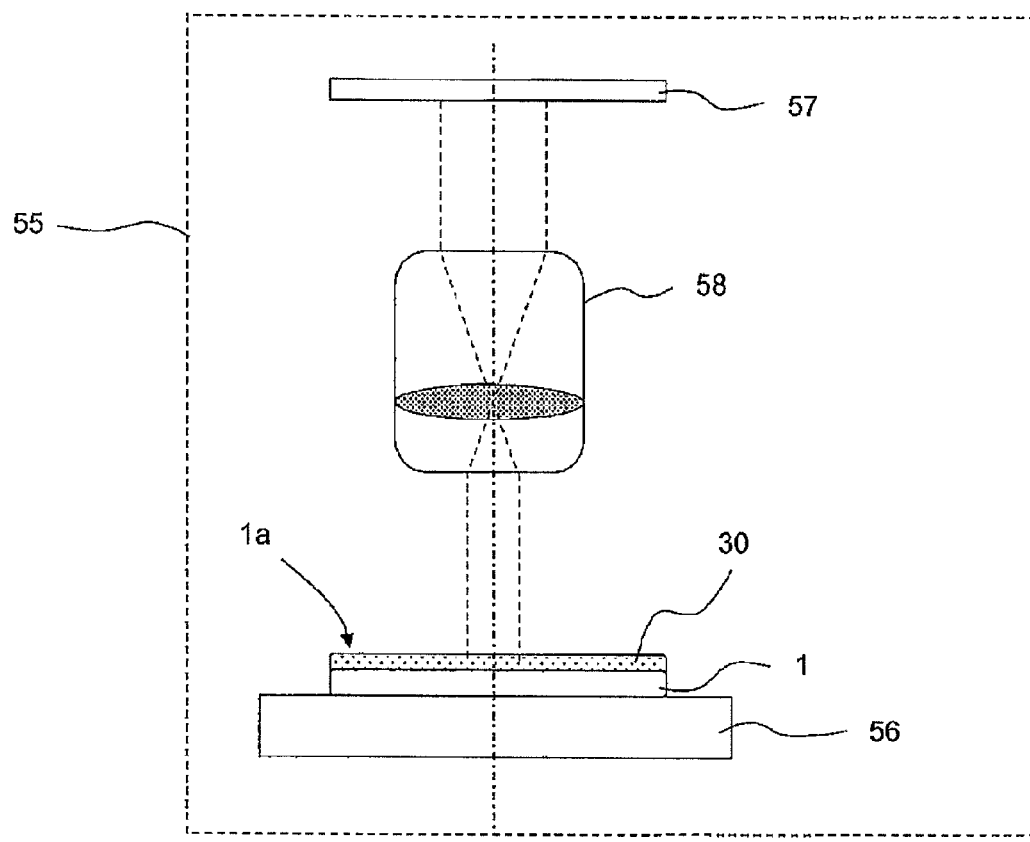
FIG. 16 is a section view of a wafer and its periphery corresponding to a B-B' section in FIG. 15 over a stage of an exposure system.
Figure 17:
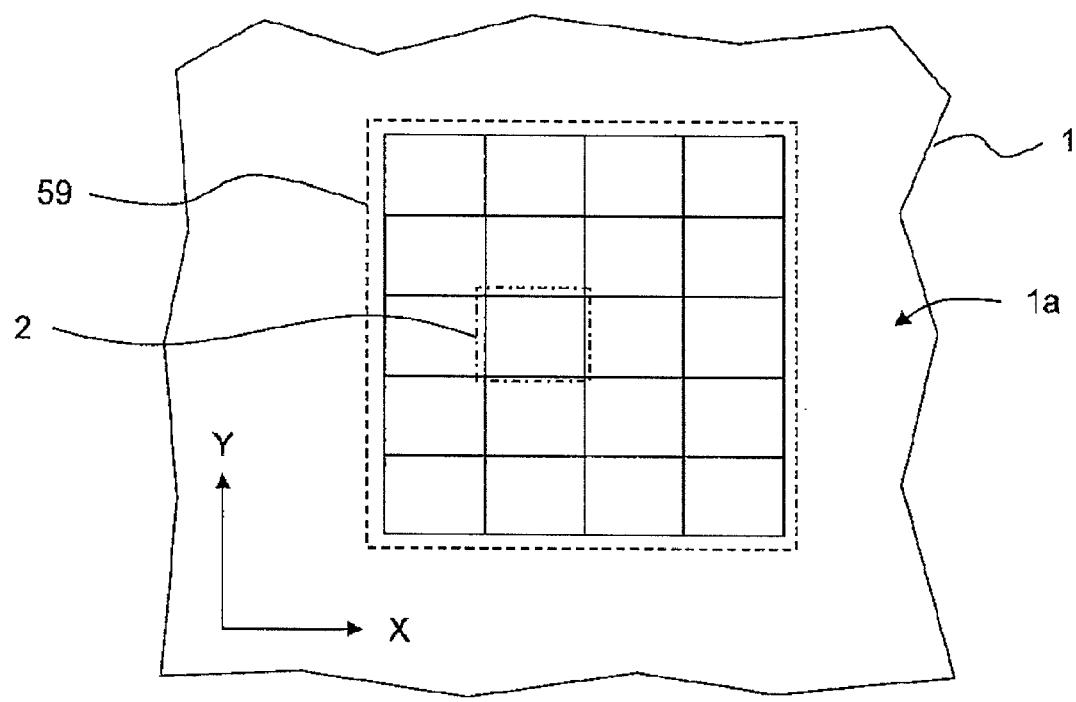
FIG. 17 is an enlarged plan view (wafer surface) of the periphery of a unit shot region 59 in FIG. 15.
Figure 18:
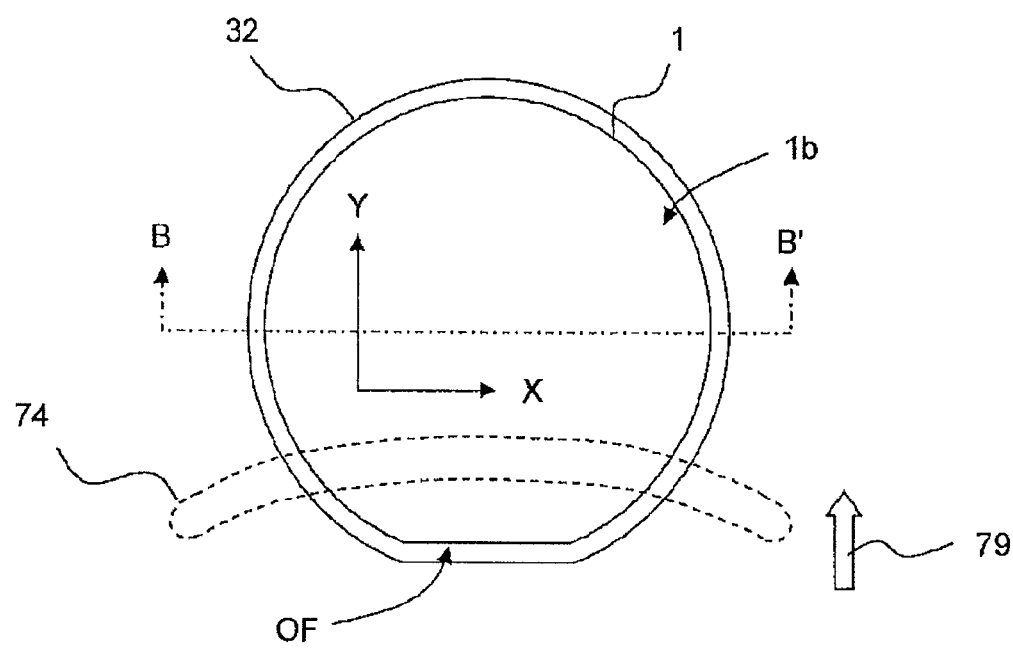
FIG. 18 is an entire diagram of a back side of a wafer etc. for explaining a relationship between a back side 1b of a wafer 1 and the surface shown in FIG. 15 when patterning a resist film 23 for implanting phosphorus ions into a collector region penetration $N^+$-region (that is, at the time of exposure) shown in FIG. 10.
Figure 19:
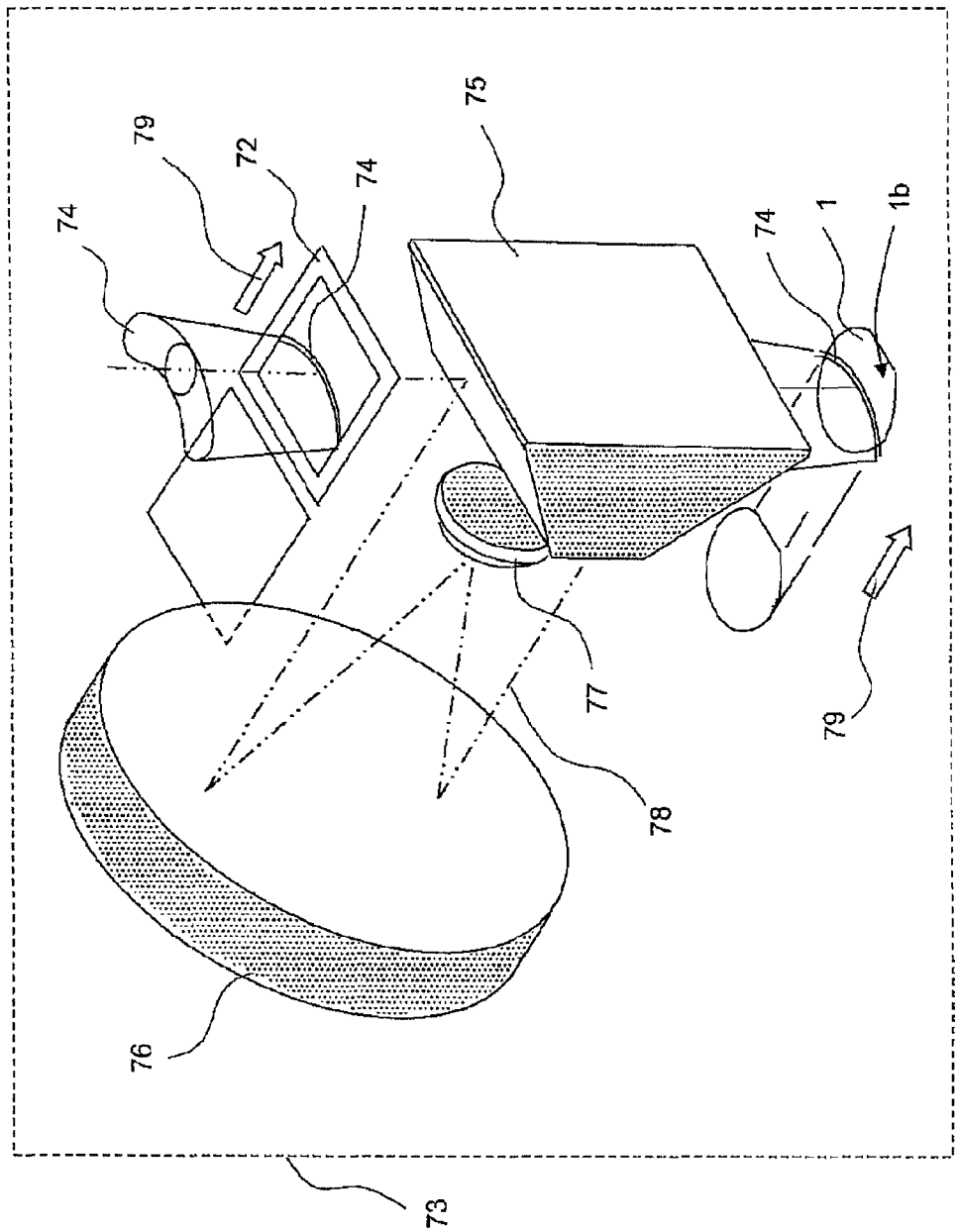
FIG. 19 is a perspective view of an exposure system showing the way of exposure of a wafer over a stage of a 1:1 projection exposure system.
Figure 20:
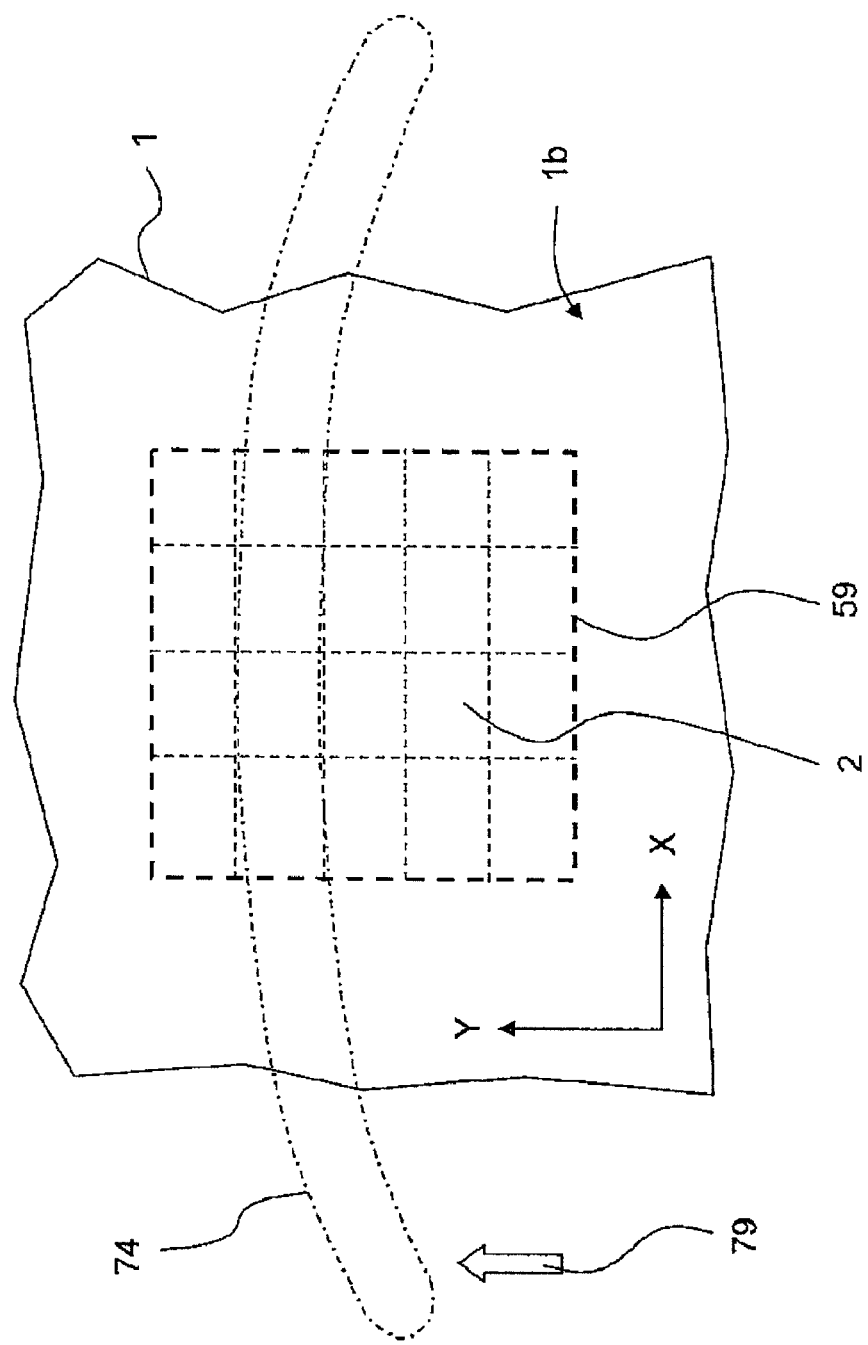
FIG. 20 is an enlarged plan view (wafer back side) of the periphery of the unit shot region 59 in FIG. 18.
Figure 21:
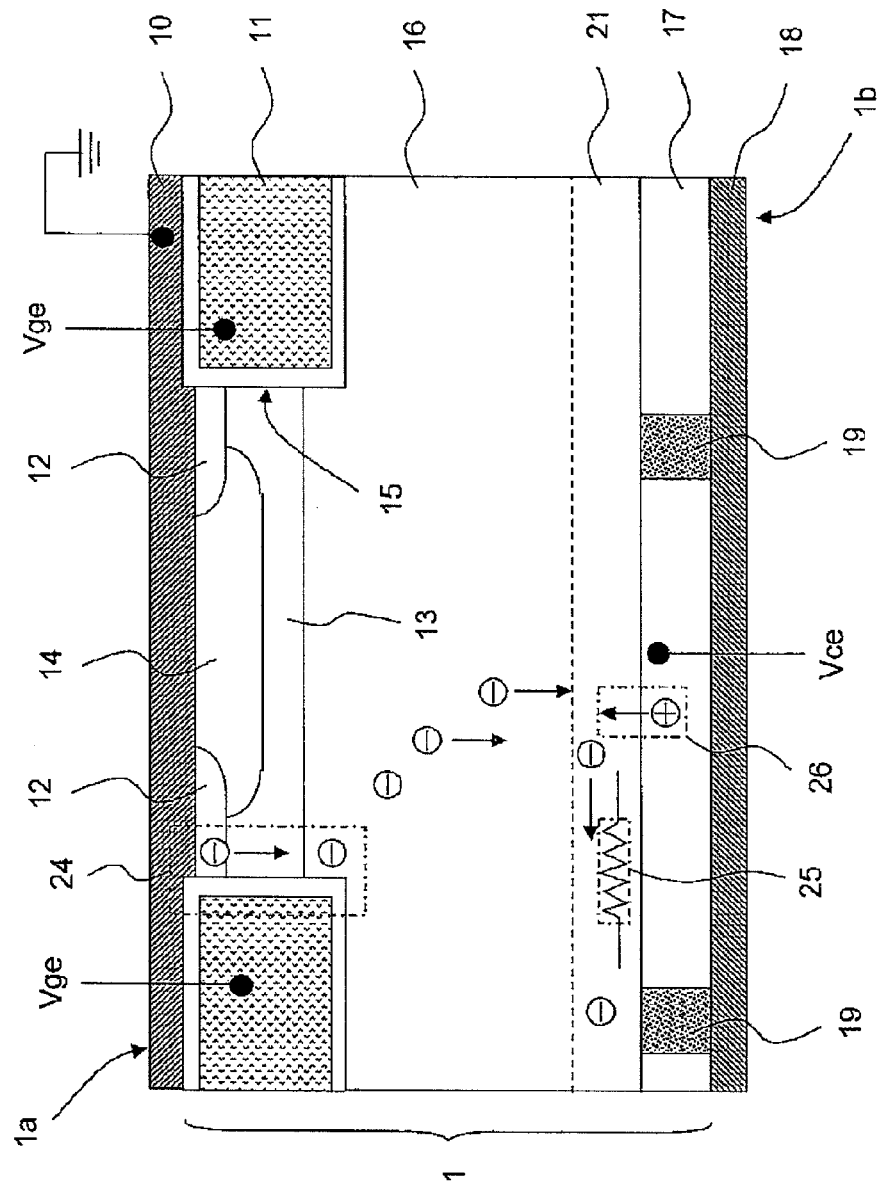
FIG. 21 is a device section view corresponding to the cell region inner unit periodic cutout part R2 in FIG. 4 for explaining the principles of the present invention.
Figure 22:
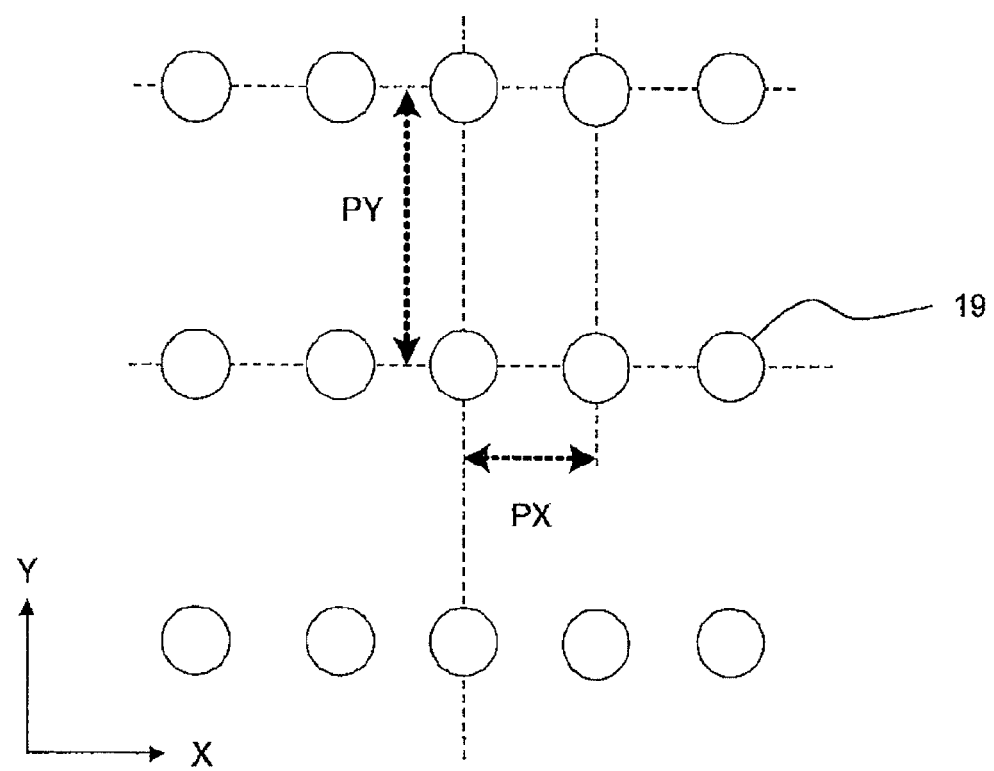
FIG. 22 is a back side diode cathode distribution diagram (basic layout: orthogonal lattice entire surface spread method) of a reverse conducting IGBT in an embodiment of the present invention.
Figure 23:
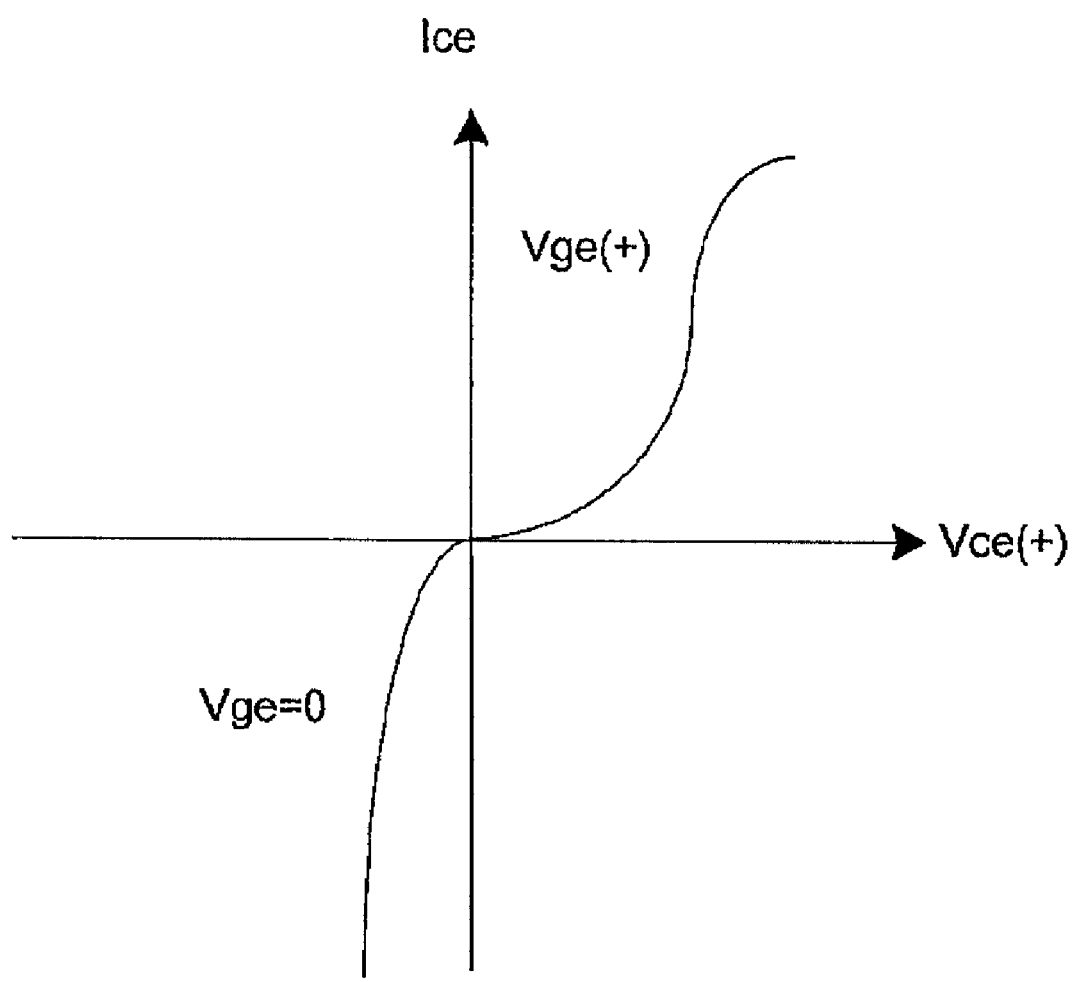
FIG. 23 is a characteristic diagram showing the device characteristics of a reverse conducting IGBT in an embodiment of the present invention.
Figure 24:
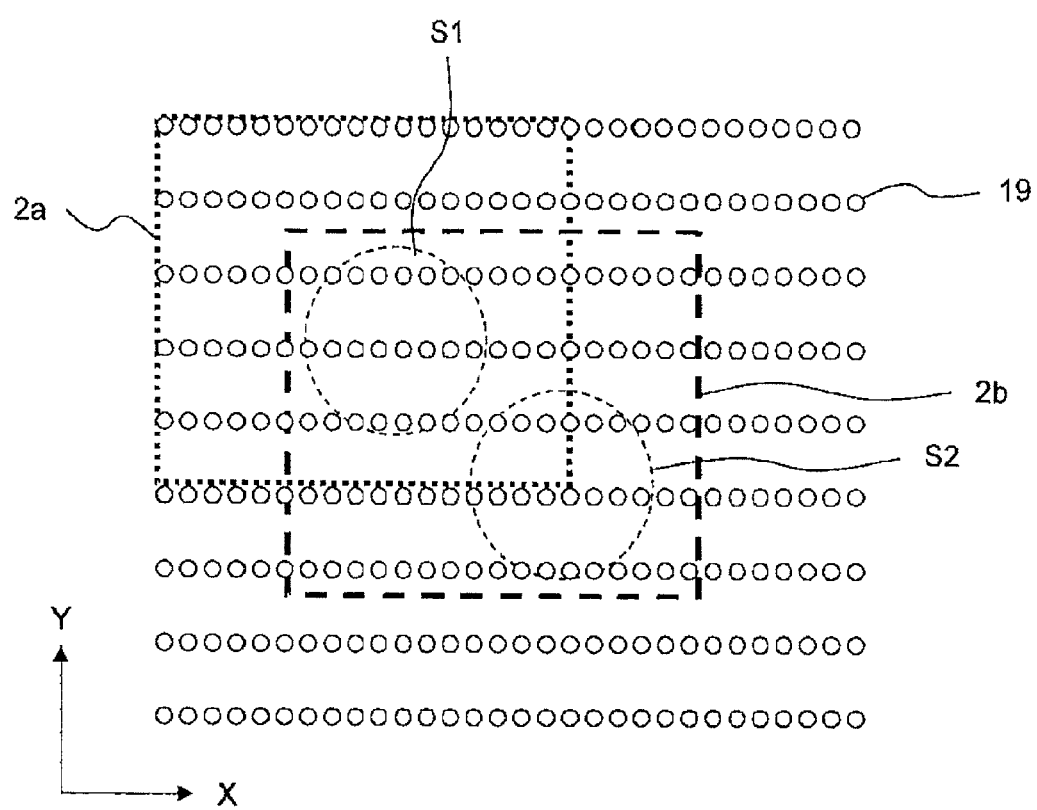
FIG. 24 is a wide-area plan view (basic layout: orthogonal lattice entire surface spread method) corresponding to FIG. 22.
Figure 25:
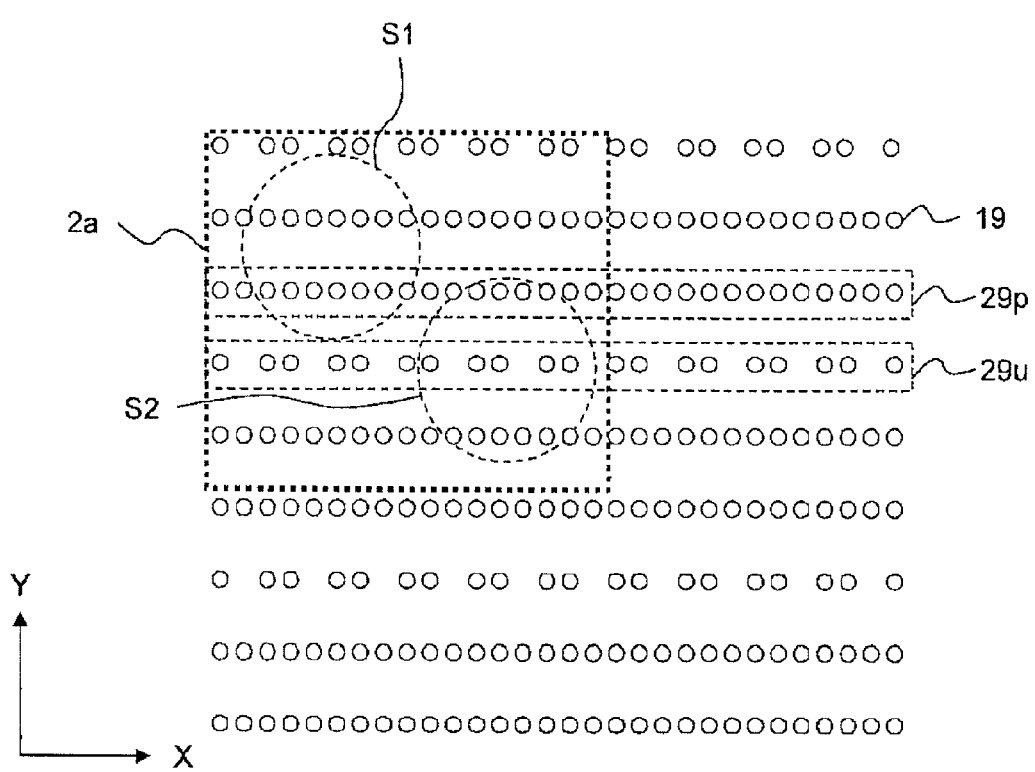
FIG. 25 is a wide-area plan view (basic layout: micro cavity & spread method) corresponding to FIG. 22.
Figure 26:
FIG. 26 a wide-area plan view (basic layout: inclined lattice entire surface spread method) corresponding to FIG. 22.

FIG. 15 is a diagram of the periphery of the back side of the wafer 1 etc. for explaining the situation of the back side 1b etc. of the wafer 1 when patterning the resist film 23 for implanting phosphorus ions into the collector region penetration N⁺ region (that is, at the time of exposure) shown in FIG. 10. FIG. 16 is a section view of the wafer and its periphery corresponding to the B-B' section in FIG. 15 over the stage of an exposure system. FIG. 17 is an enlarged plan view (wafer back side) of the periphery of the unit shot region 59 in FIG. 15. FIG. 18 is an entire diagram of the back side of the wafer etc. for explaining a relationship between the back side 1b of the wafer 1 and the surface shown in FIG. 15 when patterning the resist film 23 for implanting phosphorus ions into the collector region penetrating N⁺ region (that is, at the time of exposure) shown in FIG. 10. FIG. 19 is a perspective view of an exposure system showing the way of exposure of the wafer over the stage of the 1:1 projection exposure system. FIG. 20 is an enlarged plan view (wafer back side) of the periphery of the unit shot region 59 in FIG. 18. FIG. 21 is a device section view corresponding to the cell region inner unit periodic cutout part R2 in FIG. 4 for explaining the principles of the present invention. FIG. 22 is a back side diode cathode distribution diagram (basic layout: orthogonal lattice entire surface spread method) of the reverse conducting IGBT in an embodiment of the present invention. FIG. 23 is a characteristic diagram showing the device characteristics of the reverse conducting IGBT in an embodiment of the present invention. FIG. 24 is a wide-area plan view (basic layout: orthogonal lattice entire surface spread method) corresponding to FIG. 22. FIG. 25 is a wide-area plan view (basic layout: micro cavity & spread method) corresponding to FIG. 22. FIG. 26 a wide-area plan view (basic layout: inclined lattice entire surface spread method) corresponding to FIG. 22. Based on these, the principles of the reverse conducting IGBT (semiconductor device), the layout of the basic diode cathode region, modified examples, etc., in an embodiment of the present application are explained.

Before the patterning of the phosphorus ion implanting resist film 23 for forming the collector region penetrating N⁺ region 19 is explained, first, based on FIG. 15 to FIG. 17 for comparison, the exposure of the pattern for the device surface 1a as shown in FIG. 3 and FIG. 4 is explained briefly. As shown in FIG. 15 to FIG. 17, the exposure of the surface 1a of the wafer 1 is performed normally, in the state where the wafer 1 on which a resist film 30 is formed on an exposure stage 56 of a reduction projection exposure system 55, by reduction-projecting (for example, reduction of 5:1) the pattern over an optical mask 57 through a projection optical system using monochrome exposure light, such as the i-line (excimer laser beam) of a mercury lamp. In this case, as shown in FIG. 17, exposure is performed for each unit shot region 59 normally by the step and repeat method or step and scan method. The unit shot region 59 normally includes a plurality of chip regions 2. Here, as shown in FIG. 15 and FIG. 17, the chip region 2 has a rectangular shape, such as a square or rectangle, and one of the main axes of the rectangular shape corresponds to the crystal orientation display part, that is, the orientation indicated by the orientation flat OF (notch may also be used). In other words, each side of the chip region 2 is substantially parallel with the X and Y axes in the figure.

In contrast to this, in the patterning of the back side, as shown in FIG. 18 to FIG. 20, for example, using an unmagnified (1:1) projection exposure system 73 etc., patterning is performed by the simultaneous exposure of the entire surface of the wafer using broadband light (including the g-line of a mercury lamp etc.). This is because, if the diode cathode region 19 is assumed to be circular, its diameter is about 45 µm and the minimum pitch, that is, a pitch PX in the X direction is, for example, about 80 µm (a pitch PY in the Y direction is, for example, as large as about 400 µm), and is by far larger than the pattern of the surface 1a. The shape of each pattern of the diode cathode region 19 may be, besides the circular shape, the rectangular shape, such as a square and rectangle, the polygonal shape, such as a triangle and quadrangle, a parallelogram (single pattern), and a set of integrated fine figures.

One example of the exposure system is explained. As shown in FIG. 19, in the projection optical system of the 1:1 reflection-type unmagnified projection exposure system 73 (for example, PA-600FA manufactured by Canon Inc.), the entire wafer 1 is exposed simultaneously at a time by scanning an arc slit-shaped illumination light flux 74 in a direction 79 normal to its center point (in fact, by moving the light flux toward a mask 72 and the wafer 1), and therefore, it belongs to a full-scan type. By shaping the illumination light flux 74 into the shape of an arc, it is possible to suppress the chromatic aberration and various kinds of aberration. As exposure light (illumination light), light in the wide band is used, for example, from the ultraviolet band to the end part of the ultraviolet in the visible light band (for example, the band including the g-, h-, i-lines of a high-pressure mercury lamp), and therefore, throughput is high and effective in patterning of a comparatively large pattern. After passing through the mask 72, the arc slit-shaped illumination light flux 74 is reflected from a trapezoid mirror 75 along an optical axis 78 and is reflected again from the trapezoid mirror 75 after passing through an concave mirror 76 and a convex mirror 77 and reaches the back side 1b of the wafer 1 and exposes the resist film 23 thereover (FIG. 10). In this case, unlike the surface exposure, the glass reinforcement plate 32 is pasted to the surface 1a of the wafer as shown in FIG. 18. FIG. 18 and FIG. 20 show an example of a mutual relationship among the unit shot region 59 of the surface exposure described above, the chip region 2, the crystal orientation display part OF (orientation flat or notch), and the X and Y axes in the figure.

Next, an appropriate layout of the diode cathode region 19 (collector region penetrating N⁺ region) in the back side exposure is explained using FIG. 21 (device section view of the unit periodic part of the cell region 8 corresponding to FIG. 5) and FIG. 22. As shown in FIG. 21, when an emitter reference gate potential Vge exceeds the threshold voltage of an internal MOSFET part 24, electrons are implanted from the source region 12 into the drift region 16, however, these electrons cross the drift region 16 and flow into the diode cathode region 19 along the N-type field stop region 21 and finally reaches the collector electrode 18. However, if the density of the diode cathode region 19 is too high, because the resistance component 25 in the N-type field stop region is small, the potential difference of the PN junction on the side of the collector terminal of the internal PNP transistor does not rise sufficiently when an emitter reference collector potential Vce increases in increment of a positive value, and therefore, it does not turn on smoothly and a so-called snap back is caused. On the other hand, if the density of the diode cathode region 19 is too low, the forward voltage drop of the diode 5 (FIG. 5) increases. In order to eliminate this tradeoff, in this example, as shown in FIG. 22, by making the pitch XP in the X axis direction (direction in which the linear gate electrode extends) of the diode cathode region 19 different from the pitch YP in the Y axis direction (direction in which the gate electrode repeats), it is made possible to realize both the rise in the potential difference of the PN junction on the side of the collector terminal of the internal PNP transistor and the suppression of the forward voltage drop of the diode. That is, the density of the pitch XP in the X direction is set sufficiently high so that a sufficiently low forward voltage drop characteristic of the diode is obtained and the density of the pitch YP in the Y direction is set sufficiently low so that the internal PNP transistor turns on smoothly.

By setting the densities of the diode cathode region 19 in the respective X and Y directions optimally in the individual directions, it is possible to obtain excellent characteristics both in the state where the IGBT element part 4 is ON (the emitter reference gate potential Vge has a positive value of Vge(+) and the emitter reference collector potential Vce also has a positive value of Vce (+)) and in the state where the backward diode 5 is ON as shown in FIG. 23.

Next, the macro characteristics of the two-dimensional layout (basic layout) of the diode cathode region 19 shown in FIG. 22 are explained. As shown in FIG. 24, a large number of the dot-shaped diode cathode regions 19 (in FIG. 24 to FIG. 26, because of the limitation of schematic representation, the number of the dot-shaped diode cathode regions in the X axis direction is reduced to ¼) are spread over the entire back side 1b of the wafer 1 so as to form an orthogonal two-dimensional lattice with the pitch XP in the X direction and the pitch YP in the Y direction as respective lattice constants. By doing so, it is possible to suppress the variations in the total number of the diode cathode regions 19 included in the unit chip region 2 even when the positions of the chips (relative position between the optical mask and the wafer) in back side exposure are different, like a chip 2a and a chip 2b.

In particular, by setting the length of the side in the X axis direction of the chip 2 to substantially an integer multiple of the pitch XP in the X direction and the length of the side in the Y axis direction of the chip 2 to substantially an integer multiple of the pitch YP in the Y direction, it is possible to further suppress the variations in the total number of the diode cathode regions 19 included in the single chip region 2 to a low degree. It is needless to say that this is not necessarily indispensable.

In this example, the pitch XP in the X direction is by far shorter than the pitch YP in the Y direction, and therefore, the total number of the diode cathode regions 19 included in the single chip region 2 is not sensitive to the shift in the X direction of the chip 2 and it is possible to sufficiently suppress the variations in the total number of the diode cathode regions 19 included in the single chip region 2 to a considerably low degree by setting only the length of the side in the Y axis direction of the chip 2 to substantially an integer multiple of the pitch YP in the Y direction. In this case also, it is needless to say that this is not necessarily indispensable.

The two-dimensional layout of the diode cathode regions 19 is not limited to the spread lattice layout in which the diode cathode regions 19 are spread (FIG. 24), that is, the layout in which substantially all of the lattice points are occupied, but comparatively flexible, however, from the viewpoint of the suppression of the variations in the element characteristics, it is effective to design a layout so that when circles S1, S2 etc. the diameters of which are about half the short side of the chip region are supposed (however, it is premised that these circles are all within the chip region), the total number of the diode cathode regions 19 does not vary so much even if these circles (referred to as "macro reference circles") are located anywhere. This is not necessarily indispensable, however, by distributing the diode cathode regions 19 comparatively uniformly in a macro view (that is, an XY two-dimensional lattice of the diode cathode regions 19 is configured in substantially the entire surface of the main surface of the chip), advantages, such as that the design is facilitated and that the positioning of the surface and the backside is no longer necessary, are obtained. That is, by aligning only the orientation of the wafer 1, it is possible to match the direction of the main axis of the chip 2 with the lattice orientation of the lattice configured by the diode cathode regions 19.

Consequently, as shown in FIG. 25 (micro removal type), it is possible to adjust the density by removing some lattice points etc. That is, it is possible to configure the two-dimensional layout of the diode cathode regions 19 by combining a filled row 29p and an unfilled row 29u. In this case also, from the viewpoint of the suppression of the variations in the element characteristics, it is effective to design a layout so that the total number of the diode cathode regions 19 included in the circles does not vary considerably even when the reference circles are located anywhere in the chip region. The example in FIG. 25 is a modified example of the example in FIG. 24 (orthogonally spread type) and the parts not explained here are the same as those in the explanation in FIG. 24. As described above, the lattice points are removed in units of lattice points in a micro manner, and therefore, in the region equivalent to the chip, the distribution is comparatively uniform and it is possible to reduce the variations in the forward characteristics of the backward diode compared to the case where one or several macro parts in which the diode cathode region 19 does not exist are formed for each chip. This advantage is common to the examples in FIG. 24 to FIG. 26. Because the density of the diode cathode region 19 is adjusted in units of unit lattices (in a micro region), the total number of the diode cathode regions 19 in each unit chip is substantially constant regardless of the relative positional relationship between a large number of the chip regions 2 and the mask 72 over the wafer 1 (FIG. 19), and therefore, it is possible to optimize the IGBT characteristics without the need to take into consideration the forward characteristics of the backward diode.

Further, as a modified example of the layout (orthogonally spread type) in FIG. 24, it is possible to mention an inclinedly spread type layout as an example in FIG. 26. In this example, each row 29 of the diode cathode region 19 is configured only by the filled row 29 but the XY lattice is formed into an inclined lattice. When the easiness of the layout is taken into consideration, it can be thought that an appropriate angle of inclination is not less than 5 degrees and not more than 30 degrees. It is assumed that a lattice having an angle of inclination less than 5 degrees is substantially included in the orthogonal lattice. In this case also, from the viewpoint of the suppression of the variations in the element characteristics, it is effective to design a layout so that the total number of the diode cathode regions 19 included in the macro reference circle does not vary considerably even when the macro reference circle is located anywhere in the chip region. It is also possible to combine this layout with that in the example in FIG. 25 to design an inclinedly removed type layout.

That is, by setting the density of the diode cathode region in the X and Y directions at the unit lattice level as shown in FIG. 24 to FIG. 26 (by setting the density in the Y direction lower than that in the X direction, or by setting the pitch in the Y direction larger than that in the X direction), it is possible to ensure the smooth operation of the internal bipolar transistor while keeping a macro uniformity. As a design procedure, it is possible to mention a method shown below as an example. (1) First, according to the explanation given with reference to FIG. 24 to FIG. 26, an appropriate XY two-dimensional structure is selected. (2) The pitch in the Y direction is determined so that the smooth operation of the internal bipolar transistor can be ensured. In this example, for example, it is about 400 μm. As an appropriate range under normal conditions, it is possible to mention about 300 to 500 μm as an example. (3) Next, the pitch in the X direction is determined so that the forward characteristics of the backward diode can be secured. In this example, it is about 80 μm, for example. As an appropriate range under normal conditions, it is possible to mention about 50 to 200 μm as an example. (4) With the exposure method and the pitch in the X direction being taken into consideration, the planar shape and area of each diode cathode region 19 are determined. In this example, it is a circle with a diameter of about 45 μm, for example. As an appropriate range under normal conditions, it is possible to mention about 10 to 100 µm as an example. (5) If necessary, the relationship between the length of each side and the pitch in the Y direction or the pitch in the X direction of the chip is adjusted in order to further reduce the variations in the forward characteristics of the backward diode.

5. Summary

The invention made by the inventors of the present invention has been explained specifically based on the embodiments, however, the present invention is not limited to those embodiments and it is needless to say that there can also be various modifications within the scope not deviating from its gist.

For example, in the embodiments, the IGBT structure having a trench type gate structure, such as a U-MOSFET, is explained specifically, however, the present invention is not limited to that and it is needless to say that the present invention can also be applied to the planar type structure etc. in quite the same way.

In the embodiments, that in which the N-channel device is formed mainly on the top surface of the N-epitaxial layer over the N$^+$-silicon single crystal substrate is explained specifically, however, the present invention is not limited to that and that in which the P-channel device is formed on the top surface of the N-epitaxial layer over the P$^+$-silicon single crystal substrate may also be accepted.

In the embodiments, the N-channel base IGBT (or NPN base) is explained mainly, however, the structure of the P-channel base IGBT (or PNP base) is obtained by performing the operation to replace N with P and P with N in all the regions.

In the embodiments, the device having the drift region configured by a single conductivity type region is explained mainly, however, it is needless to say that a drift region having a super junction structure may also be accepted.

Further, in the embodiments, the example is explained, in which the non-epitaxial wafer is used and the high concentration impurity layer is formed from the back side after the back grinding, however, the present invention is not limited to that and it is needless to say that the present invention can also be applied to that which is manufactured using an epitaxial wafer.

In the embodiments, the punch-through type IGBT is explained specifically, however, the present invention is not limited to that and it is needless to say that the present invention can also be applied to a non-punch-trough type IGBT without a field stop layer substantially as it is.

What is claimed is:

1. A reverse conducting IGBT comprising:
   (a) a rectangular semiconductor substrate having a first and a second main surfaces;
   (b) a drift region of a first conductivity type occupying essential parts of the semiconductor substrate;
   (c) an IGBT cell region provided in a surface region of the first main surface of the semiconductor substrate and having a large number of linear gate electrodes extending in an X direction;
   (d) a collector region of a second conductivity type provided across substantially the entire surface in a surface region of the second main surface of the semiconductor substrate;
   (e) a large number of dot-shaped diode cathode regions of a first conductivity type provided in a surface region of the second main surface of the semiconductor substrate so as to penetrate through the collector region; and
   (f) a back side metal electrode layer provided over the second main surface so as to short-circuit the collector region and the large number of dot-shaped diode cathode regions,
   wherein the large number of dot-shaped diode cathode regions constitute an XY two-dimensional lattice in the second main surface;
   the lattice constant in the X direction differs from that in a Y direction; and
   the lattice constant in the Y direction is longer than that in the X direction.

2. The reverse conducting IGBT according to claim 1, wherein the XY two-dimensional lattice is an orthogonal lattice.

3. The reverse conducting IGBT according to claim 2, wherein each linear gate electrode of the large number of linear gate electrodes extends along the X direction.

4. The reverse conducting IGBT according to claim 3, wherein the large number of dot-shaped diode cathode regions are spread uniformly across the entire surface of the second main surface.

5. The reverse conducting IGBT according to claim 4, wherein the length of a side in the Y direction of the semiconductor substrate is substantially an integer multiple of the lattice constant in the Y direction.

6. The reverse conducting IGBT according to claim 5, wherein the length of a side in the X direction of the semiconductor substrate is substantially an integer multiple of the lattice constant in the X direction.

7. The reverse conducting IGBT according to claim 6, wherein the whole drift region is a semiconductor region of a first conductivity type.

8. The reverse conducting IGBT according to claim 7, further comprising:
   (g) a field stop region provided between the drift region and the collector region and having a first conductivity type with concentration higher than that of the drift region.

9. The reverse conducting IGBT according to claim 8, wherein the first conductivity type is an N type and the second conductivity type is a P type.

10. The reverse conducting IGBT according to claim 4, wherein the large number of dot-shaped diode cathode regions constitute the XY two-dimensional lattice in substantially the entire surface of the second main surface.

11. A reverse conducting IGBT comprising;
   (a) a rectangular semiconductor substrate having a first and a second main surfaces;
   (b) a drift region having a first conductivity-type region occupying essential parts of the semiconductor substrate;
   (c) an IGBT cell region provided in a surface region of the first main surface of the semiconductor substrate and having a large number of linear gate electrodes extending in an X direction;
   (d) a collector region of a second conductivity type provided across substantially the entire surface in a surface region of the second main surface of the semiconductor substrate;
   (e) a large number of dot-shaped diode cathode regions of a first conductivity type provided in a surface region of the second main surface of the semiconductor substrate so as to penetrate through the collector region; and
   (f) a back side metal electrode layer provided over the second main surface so as to short-circuit the collector region and the large number of dot-shaped diode cathode regions, wherein the large number of dot-shaped diode cathode regions constitute an XY two-dimensional lattice in the second main surface, the lattice constant in the X direction differs from that in a Y direction, and the lattice constant in the Y direction is longer than that in the X direction.

12. The reverse conducting IGBT according to claim 11,
wherein the XY two-dimensional lattice is an orthogonal lattice.

13. The reverse conducting IGBT according to claim 12,
wherein each linear gate electrode of the large number of linear gate electrodes extends along the X direction.

14. The reverse conducting IGBT according to claim 13,
wherein the large number of dot-shaped diode cathode regions are spread uniformly across the entire surface of the second main surface.

15. The reverse conducting IGBT according to claim 14,
wherein the length of a side in the Y direction of the semiconductor substrate is substantially an integer multiple of the lattice constant in the Y direction.

16. The reverse conducting IGBT according to claim 15,
wherein the length of a side in the X direction of the semiconductor substrate is substantially an integer multiple of the lattice constant in the X direction.

17. The reverse conducting IGBT according to claim 16, further comprising:
(g) a field stop region provided between the drift region and the collector region and having a first conductivity type with concentration higher than that of the drift region.

18. The reverse conducting IGBT according to claim 17,
wherein the first conductivity type is an N type and the second conductivity type is a P type.

19. The reverse conducting IGBT according to claim 14,
wherein the large number of dot-shaped diode cathode regions constitute the XY two-dimensional lattice in substantially the entire surface of the second main surface.

20. The reverse conducting IGBT according to claim 11,
wherein the large number of dot-shaped diode cathode regions occupy almost all lattice points of the XY two-dimensional lattice in the second main surface.

* * * * *